United States Patent
Suzuki et al.

(10) Patent No.: US 8,971,372 B2
(45) Date of Patent: Mar. 3, 2015

(54) SURFACE EMITTING LASER DEVICE AND ATOMIC OSCILLATOR

(71) Applicants: Ryoichiro Suzuki, Miyagi (JP); Shunichi Sato, Miyagi (JP)

(72) Inventors: Ryoichiro Suzuki, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 23 days.

(21) Appl. No.: 13/942,067

(22) Filed: Jul. 15, 2013

(65) Prior Publication Data

US 2014/0023104 A1  Jan. 23, 2014

(30) Foreign Application Priority Data

Jul. 23, 2012  (JP) ................ 2012-163012
May 31, 2013  (JP) ................ 2013-114880

(51) Int. Cl.
*H01S 5/00* (2006.01)
*H01S 5/42* (2006.01)
*H01S 5/183* (2006.01)
*G04F 5/14* (2006.01)
*H01S 5/40* (2006.01)

(52) U.S. Cl.
CPC ............ *H01S 5/423* (2013.01); *H01S 5/18358* (2013.01); *G04F 5/14* (2013.01); *H01S 5/18311* (2013.01); *H01S 5/18341* (2013.01); *H01S 5/18369* (2013.01); *H01S 5/18377* (2013.01); *H01S 5/4087* (2013.01)
USPC ............... 372/50.124; 372/50.12; 372/50.121

(58) Field of Classification Search
CPC ............ H01S 5/18; H01S 5/183; H01S 5/40; H01S 5/4025; H01S 5/42

USPC .............................. 372/50.12, 50.121, 50.124
See application file for complete search history.

(56) References Cited

U.S. PATENT DOCUMENTS

| 6,117,699 | A | 9/2000 | Lemoff et al. |
| 7,684,458 | B2 | 3/2010 | Sato et al. |

(Continued)

FOREIGN PATENT DOCUMENTS

| JP | 2751814 | 5/1998 |
| JP | 11-330631 | 11/1999 |

(Continued)

OTHER PUBLICATIONS

Applied Physics Express, vol. 2, pp. 092501-092503 (2009).

(Continued)

*Primary Examiner* — Armando Rodriguez
(74) *Attorney, Agent, or Firm* — Cooper & Dunham LLP

(57) ABSTRACT

A surface emitting laser device includes a substrate, a lower reflector, an active layer, an upper reflector, and surface emitting lasers configured to emit light. A second phase adjustment layer, a contact layer, a first phase adjustment layer, and a wavelength adjustment layer are successively layered from the active layer side. The total optical thickness from the active layer side of the second phase adjustment layer to the midsection of the wavelength adjustment layer is approximately $(2N+1)\times\lambda/4$, where $\lambda$ represents a wavelength of light, and N represents a positive integer. The optical thickness from the active layer side of the second phase adjustment layer to the midsection of the contact layer is approximately $N\lambda/2$. At least two of the surface emitting lasers have the wavelength adjustment layer arranged at different thicknesses and are configured to emit light with different wavelengths.

19 Claims, 21 Drawing Sheets

(56) References Cited

U.S. PATENT DOCUMENTS

| | | |
|---|---|---|
| 7,693,204 B2 | 4/2010 | Sato et al. |
| 7,720,125 B2 | 5/2010 | Jikutani et al. |
| 7,746,912 B2 | 6/2010 | Motomura et al. |
| 7,957,444 B2 | 6/2011 | Itoh et al. |
| 7,978,739 B2 | 7/2011 | Sugawara et al. |
| 7,981,700 B2 | 7/2011 | Sato et al. |
| 8,035,676 B2 | 10/2011 | Harasaka et al. |
| 8,089,498 B2 | 1/2012 | Sato et al. |
| 8,179,414 B2 | 5/2012 | Sato et al. |
| 8,208,511 B2 | 6/2012 | Sato et al. |
| 8,416,822 B2 | 4/2013 | Shouji et al. |
| 8,421,837 B2 | 4/2013 | Itoh et al. |
| 8,441,511 B2 | 5/2013 | Harasaka et al. |
| 2008/0055672 A1 | 3/2008 | Watanabe et al. |
| 2009/0295902 A1 | 12/2009 | Sato et al. |
| 2010/0328747 A1 | 12/2010 | Jikutani et al. |
| 2011/0037825 A1 | 2/2011 | Jikutani et al. |
| 2011/0128343 A1 | 6/2011 | Sato et al. |
| 2011/0170155 A1 | 7/2011 | Jikutani et al. |
| 2011/0176122 A1 | 7/2011 | Kaminishi et al. |
| 2011/0217077 A1 | 9/2011 | Harasaka et al. |
| 2011/0228035 A1 | 9/2011 | Ishii et al. |
| 2011/0261850 A1 | 10/2011 | Shouji et al. |
| 2011/0304684 A1 | 12/2011 | Numata et al. |
| 2012/0057902 A1 | 3/2012 | Shouji et al. |
| 2012/0121297 A1 | 5/2012 | Jikutani et al. |
| 2012/0251182 A1 | 10/2012 | Adachi et al. |
| 2012/0294652 A1 | 11/2012 | Itoh et al. |
| 2013/0070039 A1 | 3/2013 | Harasaka et al. |

FOREIGN PATENT DOCUMENTS

| | | |
|---|---|---|
| JP | 2000-058958 | 2/2000 |
| JP | 2004-288789 | 10/2004 |
| JP | 2006-302955 | 11/2006 |
| JP | 2008-053353 | 3/2008 |
| JP | 2008-283129 | 11/2008 |
| JP | 2009-188598 | 8/2009 |

OTHER PUBLICATIONS

Applied Physics Letters, vol. 85, pp. 1460-1462 (2004).
Comprehensive Microsystems, vol. 3, pp. 571-612.
Proc. of SPIE, vol. 6132 613208-1 (2006).

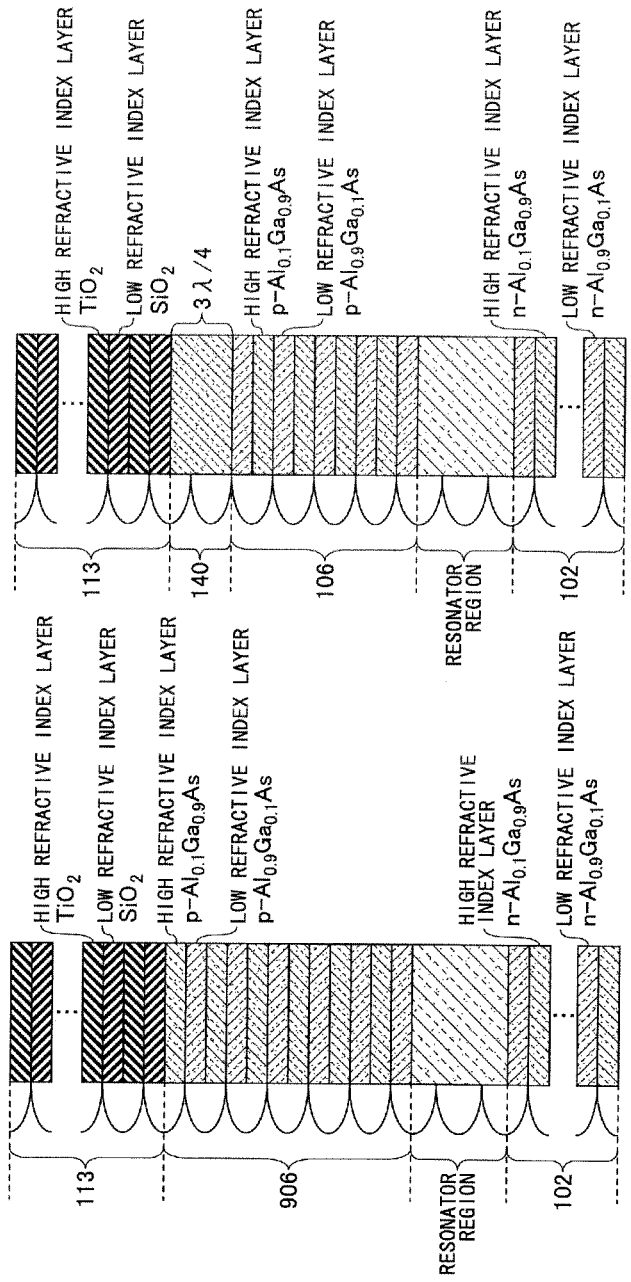

SURFACE EMITTING LASER DEVICE AND ATOMIC OSCILLATOR

BACKGROUND OF THE INVENTION

1. Field of the Invention

The present invention relates to a surface emitting laser device and an atomic oscillator.

2. Description of the Related Art

A vertical cavity surface emitting laser (VCSEL) is a semiconductor laser that is capable of emitting light in the direction orthogonal to its substrate. When compared with an edge emitting semiconductor laser that emits light in the direction parallel to its substrate, the VCSEL may have some advantageous features such as lower cost, lower energy consumption, smaller size, higher performance, and easier application to two-dimensionally integrated devices, for example.

A typical surface emitting laser has a resonator structure that includes an active layer including a resonator region, an upper reflector that is arranged on an upper side of the resonator region, and a lower reflector that is arranged on a lower side of the resonator region (See e.g., Japanese Laid-Open Patent Publication No. 2008-53353). In order to obtain light with an oscillation wavelength $\lambda$, the resonator region is arranged to have a predetermined optical thickness so that light with the wavelength $\lambda$ may oscillate at the resonator region. The upper reflector and the lower reflector are multilayer structures that are formed by alternately layering materials with varying refractive indexes. That is, the upper reflector and the lower reflector comprise Distributed Bragg Reflectors (DBR) that are formed by alternately laminating a low refractive index layer and a high refractive index layer. The optical film thicknesses of the low refractive index layer and the high refractive index layer are arranged to be $\lambda/4$ so that high reflectance may be obtained at the wavelength $\lambda$.

A multi-wavelength surface emitting laser device that has a plurality of surface emitting lasers for emitting light at different wavelengths formed within a chip is known, and such a multi-wavelength surface emitting laser device is expected to be used in various fields such as wavelength-division multiplexing (WDM) (See, e.g., Japanese Patent No. 2751814, Japanese Laid-Open Patent Publication No. 2000-58958, Japanese Laid-Open Patent Publication No. 11-330631, and Japanese Laid-Open Patent Publication No. 2008-283129). As for the method of manufacturing such a multi-wavelength surface emitting laser device, for example, Japanese Patent No. 2751814 discloses alternately laminating two different types of materials to form a wavelength adjustment layer, using two different types of etching solutions that are capable of etching the materials to partially remove the materials of the wavelength adjustment layer, and arranging the wavelength adjustment layer to have different film thicknesses. Because such a wavelength adjustment layer is formed within a resonator region, by arranging the wavelength adjustment layer to have different film thicknesses, the optical thickness of the resonator region may be different for each surface emitting laser. Such a method of manufacturing the surface emitting laser device may be advantageous in view of wavelength controllability and ease of manufacture, for example.

According to the method disclosed in Japanese Patent No. 2751814, after partially removing the wavelength adjustment layer made of semiconductor materials one layer at a time through wet etching to form the surface emitting lasers, an upper reflector and a contact layer are formed on the wavelength adjustment layer through crystal growth of the semiconductor material. The contact layer is connected to one electrode and the other electrode is formed on the rear face of the substrate. However, in a surface emitting laser device having such a structure, because the wavelength adjustment layer is formed by alternately laminating different materials, when a current flows through the wavelength adjustment layer, electrical resistance may increase due to band discontinuity at the interfaces of the different material layers. Also, because the wavelength adjustment layer is arranged to have different thicknesses for the surface emitting lasers, there may be variations in the electrical resistance of the surface emitting lasers as well.

Accordingly, a surface emitting laser device is preferably structured so that each surface emitting laser has a wavelength adjustment layer and an active layer into which a current may be injected so that the current does not flow through the wavelength adjustment layer. Also, when a contact layer is formed at a position close to the wavelength adjustment layer, the contact layer may not necessarily be positioned at a node of an optical standing wave within the laminated structure, and in such case, adequate laser performance may not be obtained.

RELATED ART DOCUMENTS

1. Japanese Laid-Open Patent Publication No. 2008-53353
2. Japanese Patent No. 2751814
3. Japanese Laid-Open Patent Publication No. 2000-58958
4. Japanese Laid-Open Patent Publication No. 11-330631
5. Japanese Laid-Open Patent Publication No. 2008-283129
6. Japanese Laid-Open Patent Publication No. 2009-188598
7. Applied Physics Express, Vol. 2, pp. 092501-092503 (2009)
8. Applied Physics Letters, Vol. 85, pp. 1460-1462 (2004)
9. Comprehensive Microsystems, Vol. 3, pp. 571-612.
10. Proc. Of SPIE, Vol. 6132 613208-1 (2006)

SUMMARY OF THE INVENTION

It is a general object of at least one embodiment of the present invention to provide a surface emitting laser device that substantially obviates one or more problems caused by the limitations and disadvantages of the related art.

According to one embodiment of the present invention, a surface emitting laser device includes a lower reflector formed on a substrate, an active layer formed on the lower reflector, an upper reflector formed on the active layer, and a plurality of surface emitting lasers configured to emit light. The surface emitting laser device further includes a second phase adjustment layer, a contact layer, a first phase adjustment layer, and a wavelength adjustment layer that are successively layered from the active layer side and are arranged within the lower reflector, between the lower reflector and the active layer, within the upper reflector, or between the upper reflector and the active layer. The total optical thickness from the active layer side of the second phase adjustment layer to a midsection of the wavelength adjustment layer is arranged to be approximately $(2N+1)\times\lambda/4$, where $\lambda$ represents a wavelength of the light emitted by the surface emitting lasers, and N represents a positive integer. The optical thickness from the active layer side of the second phase adjustment layer to a midsection of the contact layer is arranged to be approximately $N\lambda/2$. The surface emitting lasers include a first surface emitting laser and a second surface emitting laser that have the wavelength adjustment layer arranged at different thicknesses and are configured to emit light with different wavelengths.

According to an aspect of the present invention, a surface emitting laser device may have desirable wavelength controllability, efficient light output at a low oscillation threshold current, and uniform electrical resistance, for example.

BRIEF DESCRIPTION OF THE DRAWINGS

FIGS. 8A and 8B illustrate a layer configuration of the surface emitting laser device of the first embodiment;

DESCRIPTION OF THE PREFERRED EMBODIMENTS

Figure 1:
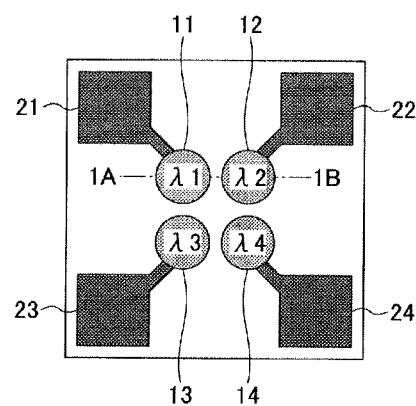
FIG. 1 is a top view of a surface emitting laser device according to a first embodiment of the present invention.

In the following, embodiments of the present invention are described with reference to the accompanying drawings. Note that identical components and features illustrated in the drawings are given the same reference numerals and repeated descriptions of the same components or features may be omitted.

First Embodiment

In the following, a surface emitting laser device according to a first embodiment of the present invention is described with reference to FIGS. 1-3. The surface emitting laser device of the present embodiment is for emitting light at an oscillation wavelength in the 894.6 nm range.

The surface emitting laser device illustrated in FIG. 1 corresponds to a semiconductor device that has four surface emitting lasers 11, 12, 13, and 14 formed on a 300 µm square semiconductor chip. FIG. 2 is a cross-sectional view of the surface emitting laser device along dot-dashed line 1A-1B of FIG. 1. Although not shown in FIG. 1, the surface emitting lasers 11, 12, 13, and 14 each have upper electrodes arranged thereon. The upper electrode of the surface emitting laser 11 is connected to electrode pad 21, the upper electrode of the surface emitting laser 12 is connected to electrode pad 22, the upper electrode of the surface emitting laser 13 is connected to electrode pad 23, and the upper electrode of the surface emitting laser 14 is connected to electrode pad 24.

Figure 2:
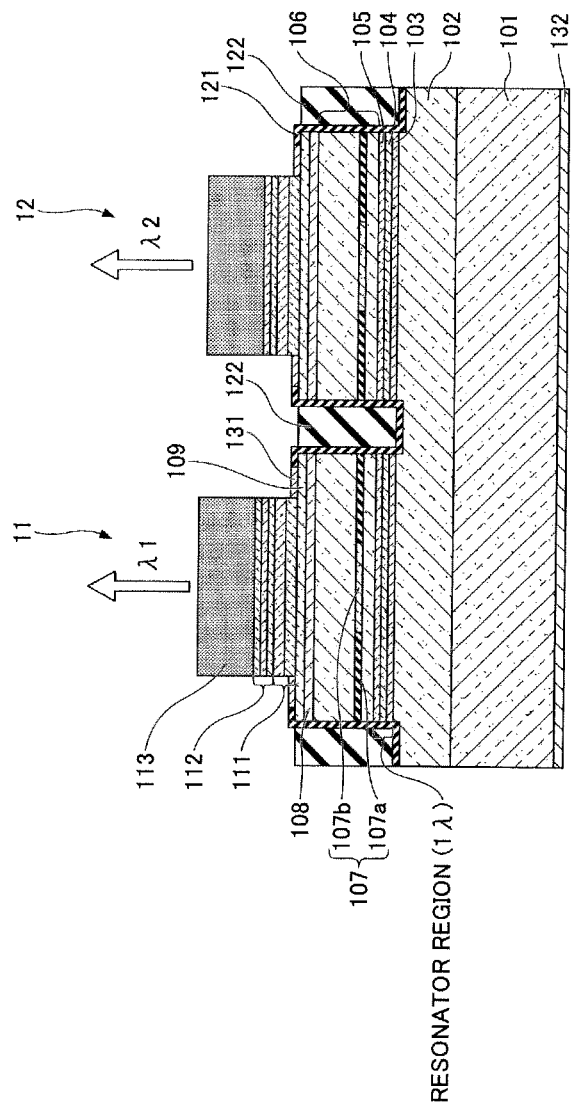
FIG. 2 is a cross-sectional view of the surface emitting laser device according to the first embodiment.

As illustrated in FIG. 2, the surface emitting laser device of the present embodiment includes a substrate 101 made of a semiconductor material on which a lower reflector 102, a lower spacer layer 103, an active layer 104, an upper spacer layer 105, a second upper reflector 106, a second phase adjustment layer 108, a contact layer 109, a first phase adjustment layer 111, a wavelength adjustment layer 112, and a first upper reflector 113 are layered. The substrate 101 is a conductive semiconductor crystal substrate. In the present embodiment, mesas are formed by partially removing the contact layer 109, the second phase adjustment layer 108, the second upper reflector 106, the upper spacer layer 105, the active layer 104, the lower spacer layer 103, and the lower reflector 102 through dry etching, for example. A current confinement layer 107 is formed within the second upper reflector 106, and side faces of the current confinement layer 107 are exposed when the mesas are formed. By oxidizing the exposed side faces of the current confinement layer 107 from the periphery of each of the mesas, a selectively oxidized region 107a may be formed at a peripheral portion of each of the mesas. In this way, a current confinement region 107b that is not oxidized is formed at a center portion of each of the mesas. A protective film 121 is arranged on the side faces of the mesas and bottom faces that are exposed by etching the above layers to form the mesas, and a polyimide layer 122 is filled into the etched regions where the layers have been removed.

Also, an upper electrode 131 is formed on a peripheral region of the upper surface of the contact layer 109 of the mesa where the first phase adjustment layer 111 is not arranged, and a lower electrode 132 is formed on the rear face of the substrate 101.

In the surface emitting laser device of the present embodiment, the wavelength adjustment layer 112 that is formed between the lower reflector 102 and the first upper reflector 113 is arranged to have different thicknesses at the surface emitting lasers 11, 12, 13, and 14. By arranging the wavelength adjustment layer 112 to have different thicknesses, the wavelengths of light emitted from the surface emitting lasers 11, 12, 13, and 14 may be arranged to vary. That is, in the present embodiment, the wavelength adjustment layer 112 is arranged to have different thicknesses so that light with a first wavelength λ1 may be emitted from the surface emitting laser 11, light with a second wavelength λ2 may be emitted from the surface emitting laser 12, light with a third wavelength λ3 may be emitted from the surface emitting laser 13, and light with a fourth wavelength λ4 may be emitted from the surface emitting laser 14 (where the wavelengths λ1-λ4 correspond to different wavelengths).

In the present embodiment, semiconductor layers such as the lower reflector 102, the lower spacer layer 103, the active layer 104, the upper spacer layer 105, the second upper reflector 106, the second phase adjustment layer 108, the contact layer 109, the first phase adjustment layer 111, and the wavelength adjustment layer 112 are epitaxially grown on the substrate 101 by MOCVD (Metal Organic Vapor Deposition) or MBE (Molecular Beam Epitaxy).

The substrate 101 is a n-GaAs substrate, and the lower reflector 102 is a multi-layer semiconductor film that is formed by alternately layering 35.5 pairs of a high refractive index layer made of n-$Al_{0.1}Ga_{0.9}As$ and a low refractive index layer made of n-$Al_{0.9}Ga_{0.1}As$ that each have an optical thickness of λ/4.

The lower spacer layer 103 and the upper spacer layer 105 are made of $Al_{0.2}Ga_{0.8}As$, and the active layer 104 is formed by alternately layering a GaInAs quantum well layer and a GaInPAs barrier layer. In the present embodiment, the lower spacer layer 103, the active layer 104, and the upper spacer layer 105 form a resonator region that has an optical thickness of approximately one wavelength (1λ).

The second upper reflector 106 is arranged on the upper spacer layer 105 and is made of a multi-layer semiconductor film that is formed by alternately layering 6 pairs of a high refractive index layer made of p-$Al_{0.1}Ga_{0.9}As$ and a low refractive index layer made of p-$Al_{0.9}Ga_{0.1}As$ that each have an optical thickness of λ/4.

Figure 3:
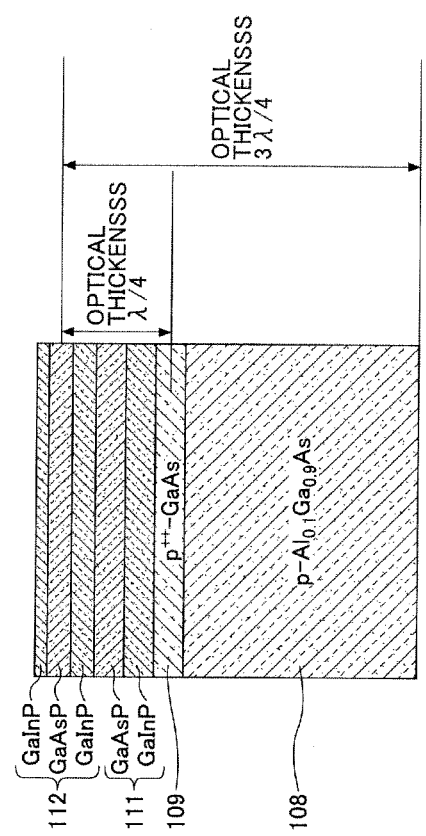
FIG. 3 is an enlarged partial cross-sectional view of the surface emitting laser device according to the first embodiment.

As illustrated in FIG. 3, in the surface emitting laser device of the present embodiment, the second phase adjustment layer 108, the contact layer 109, the first phase adjustment layer 111, and the wavelength adjustment layer 112 are successively layered on the second upper reflector 106 in this order. In the present embodiment, the second phase adjustment layer 108 is made of p-$Al_{0.1}Ga_{0.9}As$, the contact layer 109 is made of $p^{++}$-GaAs, the first phase adjustment layer 111 is made of a GaInP/GaAsP two-layer film, and the wavelength adjustment layer 112 is made of a GaInP/GaAsP/GaInP three-layer film.

In the surface emitting laser device of the present embodiment, an optical thickness from the bottom side of the second phase adjustment layer 108 to the midsection of the wavelength adjustment layer 112; namely, the total optical thickness of the second phase adjustment layer 108, the contact layer 109, the first phase adjustment layer 111, and half the wavelength adjustment layer 112, is arranged to be approximately 3λ/4. Note that in the following descriptions, the region from the bottom side of the second phase adjustment layer 108 to the midsection of the wavelength adjustment layer 112 may be referred to as "wavelength adjustment region," and the optical thickness of this wavelength adjustment region may be referred to as "optical thickness of wavelength adjustment region." Also, in the present embodiment, the optical thickness from the midsection of the contact layer 109 to the midsection of the wavelength adjustment layer 112 is arranged to be approximately λ/4. Further, in the present embodiment, the refractive indexes of the materials forming the second phase adjustment layer 108, the contact layer 109, the first phase adjustment layer 111, and the wavelength adjustment layer 112 are close to the refractive index of the high refractive index layer material of the second upper reflector 106. Thus, the second phase adjustment layer 108, the contact layer 109, the first phase adjustment layer 111, and the wavelength adjustment layer 112 may function as a part of the high refractive index layers of the second upper reflector 106.

In the surface emitting laser device of the present embodiment, the wavelength adjustment layer 112 is arranged to have different thicknesses at the surface emitting lasers 11, 12, 13, and 14. Specifically, after forming the GaInP/GaAsP/GaInP three-semiconductor-layer film as the wavelength adjustment layer 112, a suitable process such as a photolithography process or a selective etching process may be performed to adjust the number of semiconductor layers making up the wavelength adjustment layer 112 from three layers, two layers, one layer, to none as is necessary or desired. For example, at the surface emitting laser 11, the wavelength adjustment layer 112 may be made of three semiconductor layers; at the surface emitting laser 12, the wavelength adjustment layer 112 may be made of two semiconductor layers; at the surface emitting laser 13, the wavelength adjustment layer 112 may be made of one semiconductor layer; and at the surface emitting laser 14, the wavelength adjustment layer 112 may not be arranged. By changing the number of semiconductor layers making up the wavelength adjustment layer 112 in the manner described above, the wavelengths of light emitted from the surface emitting lasers 11, 12, 13, and 14 may be arranged to vary.

In the present embodiment, the semiconductor layers of the wavelength adjustment layer 112 may be removed one layer at a time through wet etching, for example. In this case, a mixed solution of sulfuric acid, hydrogen peroxide and water may be used as the etching solution for removing GaAsP, for example. Also, a mixed solution of hydrochloric acid and water may be used as an etching solution for removing the GaInP, for example. Further, in the present embodiment, after the above wet etching process, the wavelength adjustment layer 112 and the first phase adjustment layer 111 are removed at the region where the upper electrode 131 is formed. In this case, a mixed solution of sulfuric acid, hydrogen peroxide and water may be used as the etching solution for removing GaAs. Note that a wavelength adjustment layer according to an embodiment of the present invention includes a first film made of a first wavelength adjustment material and a second film made of a second wavelength adjustment material. In the present embodiment, the wavelength adjustment layer 112 includes GaInP as the first wavelength adjustment material and GaAsP as the second wavelength adjustment material. Also, in the present embodiment, the etching solution used for etching the first wavelength adjustment material GaInP corresponds to a first etching solution, and the etching solution used for etching the second wavelength adjustment material GaAsP corresponds to a second etching solution.

After etching the wavelength adjustment layer 112 in the manner described above, mesas are formed through dry etching, for example, by removing layers at predetermined regions to a certain depth so that the side faces of the current confinement layer 107 may be exposed. For example, in FIG. 2, the mesas are formed by removing the lower spacer layer 103, the active layer 104, the upper spacer layer 105, the second upper reflector 106, the second phase adjustment layer 108, and the contact layer 109 to expose the lower reflector 102. The top view shapes of the mesas may be arranged into circular shapes as in the present embodiment (see FIG. 1), or the mesas may be arranged into oval shapes, rectangular shapes, or square shapes, for example.

By forming the mesas through etching as described above, the side faces of the current confinement layer 107 may be exposed. Then, each of the mesas is heat-treated with steam to oxidize the current confinement layer 107 made of AlAs from the periphery of the mesa to form the selectively oxidized region 107a made of $Al_xO_y$. In this way, the selectively oxidized region 107a is formed at the peripheral portion of the mesa, and a non-oxidized region of the current confinement layer 107 at the center portion of the mesa becomes the current confinement region 107b. By forming the selectively oxidized region 107a at the current confinement layer 107, a current confinement structure may be formed so that a current flow within the current confinement layer 107 may be restricted to the current confinement region 107b.

Then, the protective film 121 that is made of SiN is arranged to cover the mesas including the side faces of the mesas. Further, the polyimide layer 122 is arranged at the regions where the semiconductor layers have been etched upon forming the mesas. The polyimide layer 122 is filled into the etched regions to planarize these regions. Then, the protective film 121 and the polyimide film 122 are removed from regions of the upper faces of the mesas where the upper electrode 131 and the first upper reflector 113 are to be formed, and the contact layer 109 and the wavelength adjustment layer 112 or the first phase adjustment layer 111 are exposed at these regions. Then, the upper electrode 131 corresponding to a p-side electrode is formed on a peripheral region of the upper face of the mesa where the contact layer 109 is exposed, and the lower electrode 132 corresponding to an n-side electrode is formed on the rear face of the substrate 101. The upper electrode 131 is formed for each of the surface emitting lasers 11-14 whereas the lower electrode 132 corresponds to a common electrode for the surface emitting lasers 11-14.

Then, the first upper reflector 113 is arranged on the region of the upper face of the mesa where the wavelength adjustment layer 112 or the phase adjustment layer 111 is exposed. The first reflector 113 is a dielectric multi-layer film that is formed by alternately layering 8.5 pairs of a high refractive index layer made of $TiO_2$ and a low refractive index layer made of $SiO_2$ that each have an optical thickness of $\lambda/4$ through electron beam evaporation, for example. Note that a dielectric multi-layer film may be formed by layering multiple layers of dielectric material.

The surface emitting lasers of the surface emitting laser device manufactured in the above-described manner are configured to emit light in an orthogonal direction with respect to the face of the substrate 101. In the present embodiment, the protective film 121 made of SiN is arranged on the side faces of the mesas and the bottom faces that are exposed through etching upon forming the mesas so that reliability of the surface emitting laser device may be improved. That is, by arranging the protective film 121 on the side faces of the mesas and the bottom faces that are exposed through etching upon forming the mesas, layers including Al that are prone to corrosion may be protected so that the reliability of the surface emitting laser device may be improved.

In the following, the features of the present embodiment relating the arrangement of the contact layer 109 below the wavelength adjustment layer 112 and adjustment of the optical thickness of the wavelength adjustment region (i.e., region from the bottom side of the second phase adjustment layer 108 to the midsection of the wavelength adjustment layer 112) to approximately $3\lambda/4$ as illustrated in FIG. 3 are described.

For example, in a case where a contact layer is arranged above a wavelength adjustment layer, the amount of current flowing through the surface emitting lasers may vary depending on the thickness of the wavelength adjustment layer at the surface emitting lasers, and in turn, the electric characteristics and light emitting characteristics of the surface emitting lasers may greatly vary due to the variations in the thickness of the wavelength adjustment layer at these surface emitting lasers. Also, when a current flows through the wavelength adjustment layer, electrical resistance may increase due to band discontinuity at the interfaces of the semiconductor layers forming the wavelength adjustment layer.

In contrast, in the present embodiment, the contact layer 109 is arranged below the wavelength adjustment layer 112. In this case, a current may be injected into the active layer 104 of each of the surface emitting lasers and a current does not have to flow through the wavelength adjustment layer 112. In this way, the surface emitting lasers with the wavelength adjustment layer 112 arranged at different thicknesses may be configured to have substantially uniform electrical characteristics and light emitting characteristics.

Figure 4A:
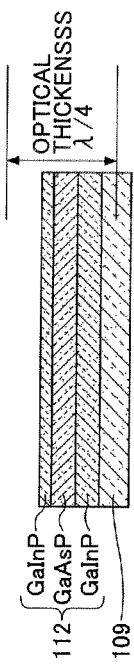
FIGS. 4A and 4B illustrate an exemplary configuration in which a wavelength adjustment layer is arranged directly above a contact layer.

In the present embodiment, the contact layer 109 is arranged below the wavelength adjustment layer 112 for the foregoing reasons. Note that for purposes of reducing light absorption, the contact layer 109 is preferably arranged where the light intensity of the optical standing wave is the weakest. In this respect, the contact layer 109 is preferably arranged to be in contact with the wavelength adjustment layer 112 as illustrated in FIG. 4A. Also, in order to prevent degradation of laser characteristics due to light absorption, the contact layer 109 is preferably arranged at the position of a node of the optical standing wave. However, in this case, as illustrated in FIG. 48, the reflectance values of the reflectors of the surface emitting lasers greatly vary from each other. As a result, there may be wide variations in the laser characteristics such as the threshold current of the surface emitting lasers. That is, in this case, the optical thickness from the contact layer 109 to the wavelength adjustment layer 112 at each of the surface emitting lasers having the wavelength adjustment layer 112 arranged at different thicknesses greatly varies from $\lambda/4$. As a result, variations occur in the reflectance of the surface emitting lasers. This in turn leads to variations in the laser characteristics such as the threshold current of the surface emitting lasers.

Figure 5A:
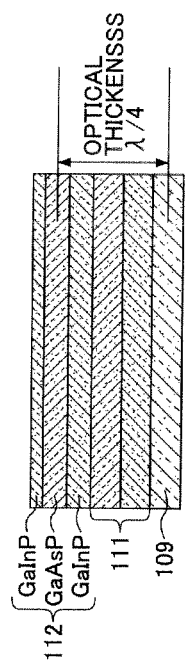
FIGS. 5A and 5B illustrate an arrangement of a first phase adjustment layer according to the first embodiment.
Figure 5B:
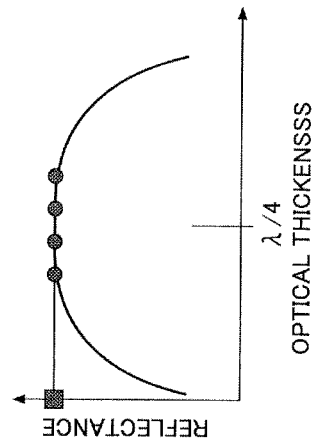

Accordingly, in the present embodiment, the first phase adjustment layer 111 is arranged between the contact layer 109 and the wavelength adjustment layer 112 as illustrated in FIG. 5A, and the thickness of the first phase adjustment layer 111 is adjusted so that the reflectance values of the surface emitting lasers may be substantially uniform. Specifically, as illustrated in FIG. 5A, the first phase adjustment layer 111 is arranged between the contact layer 109 and the wavelength adjustment layer 112 so that the optical thickness from the midsection of the contact layer 109 to the midsection of the wavelength adjustment layer 112 may be approximately $\lambda/4$. In this way, as illustrated in FIG. 5B, the reflectance values of the surface emitting lasers with the wavelength adjustment layer 112 arranged at different thicknesses may be substantially uniform.

In the following, the relationship between the second upper reflector 106 and the contact layer 109 is described. The contact layer 109 is made of $p^{++}$-GaAs, and the refractive index value of the contact layer 109 is closer to the refractive index value of $p$-$Al_{0.1}Ga_{0.9}As$ that forms the high refractive index layer of the second upper reflector 106 than the refractive index value of $p$-$Al_{0.9}Ga_{0.1}As$ that forms the low refractive index layer of the second upper reflector 106.

Figure 6:
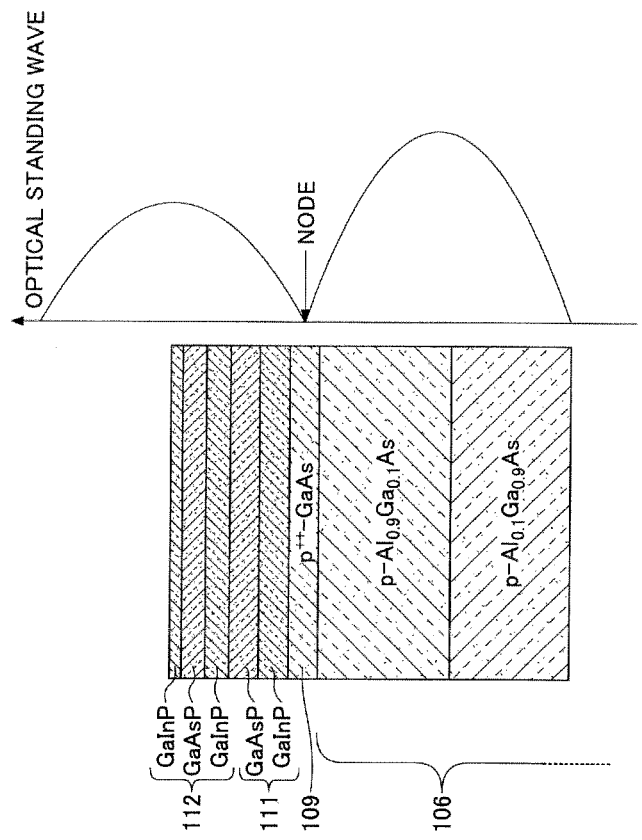
FIG. 6 illustrates an exemplary configuration in which the contact layer is arranged to directly above a second upper reflector.

For example, in a case where the contact layer 109 is formed directly above the second upper reflector 106 to be in contact with the $p$-$Al_{0.9}Ga_{0.1}As$ layer forming the low refractive index layer of the second upper reflector 106 as illustrated in FIG. 6, because a node is positioned substantially at the midsection of the contact layer 109, the interface between the contact layer 109 and the p-$Al_{0.9}Ga_{0.1}As$ layer forming the low refractive index layer of the second upper reflector 106 would not be positioned at a node. Thus, the overall reflectance of the reflectors may be degraded in this case.

Figure 7:
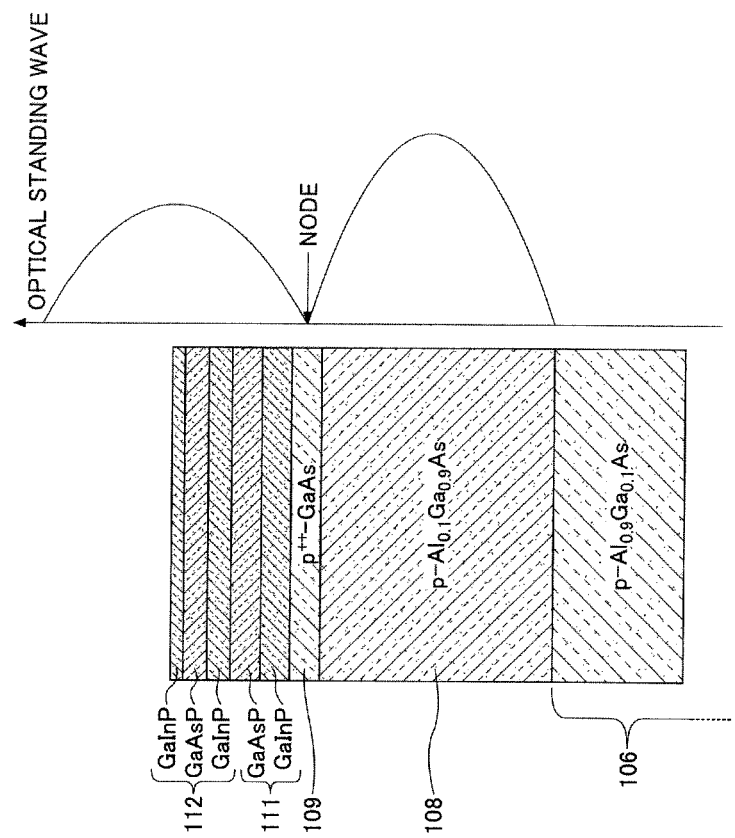
FIG. 7 illustrates an arrangement of a second phase adjustment layer according to the first embodiment.

In contrast, in the present embodiment, as illustrated in FIG. 7, the second phase adjustment layer 108 is arranged below the contact layer 109 to be in contact with the contact layer 109. The second phase adjustment layer 108 is made of a material such as p-$Al_{0.1}Ga_{0.9}As$ that has a refractive index that is the same or similar to the refractive index of the contact layer 109. The second phase adjustment layer 108 is arranged so that the total optical thickness of the second phase adjustment layer 108, the contact layer 109, the first phase adjustment layer 111, and half the wavelength adjustment layer 112 may be approximately $3\lambda/4$. By arranging the second phase adjustment layer 108 that is made of a p-$Al_{0.1}Ga_{0.9}As$ layer with a predetermined optical thickness between the p-$Al_{0.9}Ga_{0.1}As$ layer forming the low refractive index layer of the second upper reflector 106 and the contact layer 109, degradation of the overall reflectance of the reflectors may be prevented.

Note that in an embodiment of the present invention, the total optical thickness of the second phase adjustment layer 108, the contact layer 109, the first phase adjustment layer 111, and half the wavelength adjustment layer 112 may be arranged to be approximately $(2N+1)\times\lambda/4$, where N represents a positive integer (i.e., N=1, 2, 3, ... ). That is, although the above total optical thickness is arranged to be approximately $3\lambda/4$ (N=1) in the present embodiment, the value of N may be greater than one (N=2, 3, ... ). However, in this case, the surface emitting lasers may be more susceptible to influences of light absorption and the threshold current of the surface emitting lasers may be increased, for example. Thus, the value of N is preferably arranged to be a relatively small value.

Also, although the optical thickness of the second phase adjustment layer 108 and half the contact layer 109 is arranged to be approximately $\lambda/2$ in the present embodiment, the optical thickness of the second phase adjustment layer 108 and half the contact layer 109 may alternatively be arranged to be approximately $\lambda \times M/2$ (where M=2, 3, 4, ... ). In this case, the distance from the contact layer 109 to the current confinement region may be increased so that electrical resistance may be reduced. However, because susceptibility to light absorption may increase in this case, the value of M is preferably arranged to be a relatively small value.

According to an aspect of the present embodiment, the second phase adjustment layer 108, the contact layer 109, the first phase adjustment layer 111, and the wavelength adjustment layer 112 are successively layered in this order; and the total optical thickness of the second phase adjustment layer 108, the contact layer 109, the first phase adjustment layer 111, and half the wavelength adjustment layer 112 is arranged to be approximately $3\lambda/4$. In this way, the reflectance of the surface emitting lasers 11, 12, 13, and 14 having the wavelength adjustment layer 112 arranged at different optical thicknesses may be substantially uniform. Also, in the present embodiment, the second phase adjustment layer 108 is arranged between the contact layer 109 and the second upper reflector 106 so that a node of the optical standing wave may be positioned at the contact layer 109. In this way, laser characteristics may be prevented from degrading and the laser characteristics and electric resistance values of the surface emitting lasers 11, 12, 13, and 14 formed on the surface emitting laser device may be arranged to be substantially uniform, for example.

Also, in the present embodiment, the surface of the contact layer 109 may be exposed by removing the first phase adjustment layer 111 through wet etching. The first phase adjustment layer 111 is formed by successively layering a GaInP layer and a GaAsP layer on the contact layer 109 made of p++-GaAs in this order. Thus, the contact layer 109 may be easily exposed by selectively etching the first phase adjustment layer 111 through wet etching.

In an alternative embodiment, the wavelength adjustment layer 112 may be formed by arranging a GaAsP/GaInP/GaAsP three-layer film, and the first phase adjustment layer 111 may be formed by arranging a single-layer of GaInP.

Note that Japanese Laid-Open Patent Publication No. 11-330631 discloses a wavelength adjustment layer made of a combination of AlGaAs and GaInP, and Japanese Patent No. 2751814 discloses a wavelength adjustment layer made of a combination of GaAs and AlGaAs. In both of these disclosures, AlGaAs that contains Al is used in the wavelength adjustment layer. Because AlGaAs contains Al, it is susceptible to corrosion such as oxidation and the reliability of the wavelength adjustment layer may be degraded as a result. Particularly, in the case where a layer is re-grown after etching the wavelength adjustment layer as disclosed in Japanese Patent No. 2751814, because the surface of the wavelength adjustment layer is exposed to the atmosphere at least during the etching process, the Al surface may be prone to oxidization and it may therefore be difficult to form an upper reflector thereon through crystal growth of a semiconductor material.

In contrast to the above disclosures, in the present embodiment, the wavelength adjustment layer is made of a combination of GaInP and GaAsP that do not contain Al. In this way, corrosion during the manufacturing process may be prevented and a reliable surface emitting laser device may be manufactured. In another embodiment, in the case of manufacturing a surface emitting laser device for emitting light with a relatively long wavelength of 1 µm or more, GaAs may be used instead of GaAsP. In this case, the manufacturing process may be facilitated because unlike a GaAsP layer, a GaAs layer would have no strain with respect to the GaAs substrate.

As described above, the surface emitting laser device of the present embodiment includes the wavelength adjustment layer 112 that is made of a high refractive index material. According to an aspect of the present embodiment, as illustrated in FIG. 8B, a layer 140 including the wavelength adjustment layer 112 and having an optical thickness of $3\lambda/4$ is arranged on the second upper reflector 106. That is, in the present embodiment, the layer 140 made of a high refractive index material and having an optical thickness of $3\lambda/4$ is arranged to replace a high refractive index layer of the second upper reflector 106. The layer 140 illustrated in FIG. 8B includes the second phase adjustment layer 108, the contact layer 109, and the first phase adjustment layer 111 in addition to the wavelength adjustment layer 112. FIG. 8A illustrates a layer configuration of a surface emitting laser that does not include a wavelength adjustment layer. In FIG. 8A, a second upper reflector 906 is formed on the resonator region in a manner similar to the manner in which the second upper reflector 106 of the present embodiment is formed, and the first upper reflector 113 is formed on the second upper reflector 906. The lower reflector 102, the second upper reflector 106, and the first upper reflector 113 comprise a Bragg reflector.

Second Embodiment

In the following, a surface emitting laser device according to a second embodiment of the present invention is described.

Figure 9B:
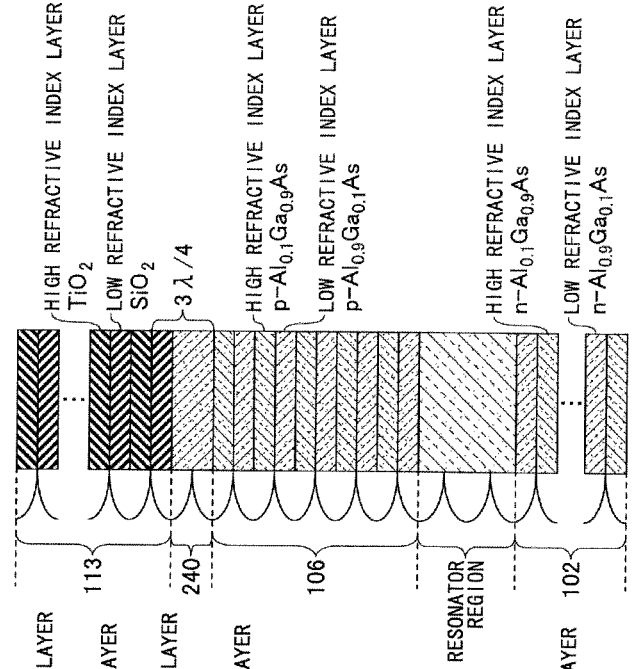
FIGS. 9A and 9B illustrate a layer configuration of a surface emitting laser device according to a second embodiment of the present invention.
Figure 9A:
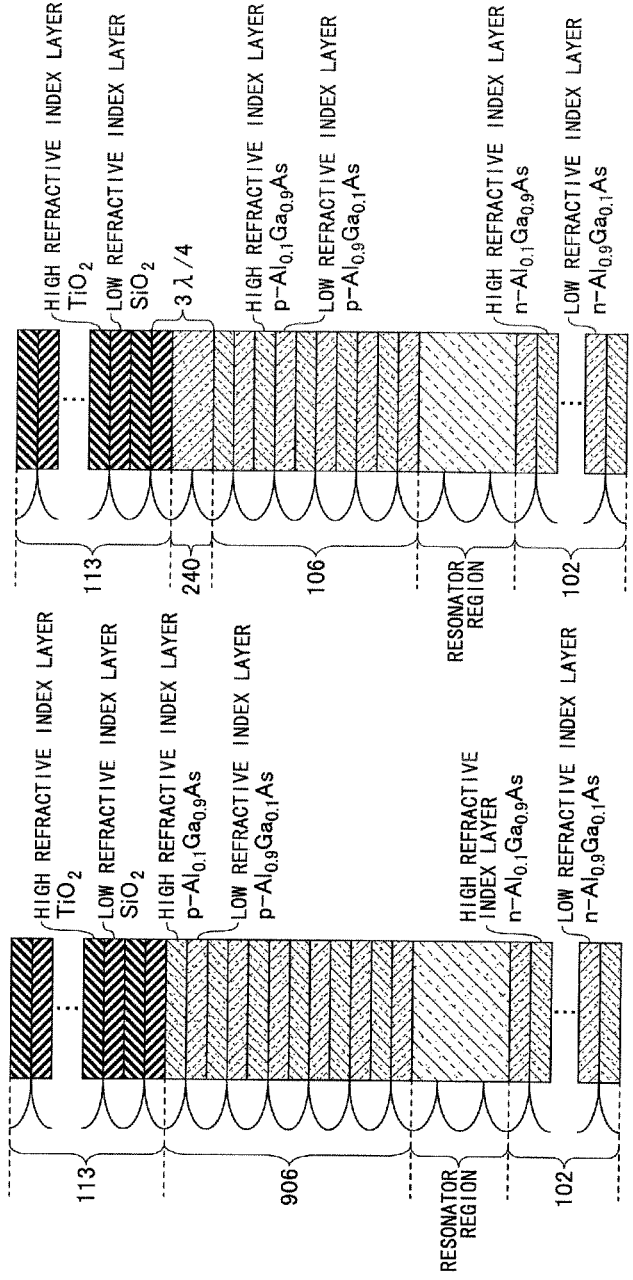

The surface emitting laser device of the present embodiment is for emitting light at an oscillation wavelength of 894.6 nm. As described above, in the surface emitting laser device of the first embodiment, the layer 140 including the wavelength adjustment layer 112 is arranged to replace one of the high refractive index layers of the second upper reflector 106. In the surface emitting laser device of the present embodiment, a layer including a wavelength adjustment layer replaces a low refractive layer. Specifically, as illustrated in FIG. 9B, in the surface emitting laser device of the present embodiment, a layer 240 including a wavelength adjustment layer 212 is made of a low refractive index material, and the total optical thickness of the layer 240 including the wavelength adjustment layer 212 and a low refractive index layer of a dielectric multi-layer film reflector with an optical thickness of $\lambda/4$ is arranged to be $3\lambda/4$. The layer 240 including the wavelength adjustment layer 212 illustrated in FIG. 9B includes the second phase adjustment layer 108, the contact layer 109, and the first phase adjustment layer 111 in addition to the wavelength adjustment layer 212. Note that the layer configuration illustrated in FIG. 9A is identical to that illustrated in FIG. 8A.

Figure 10:
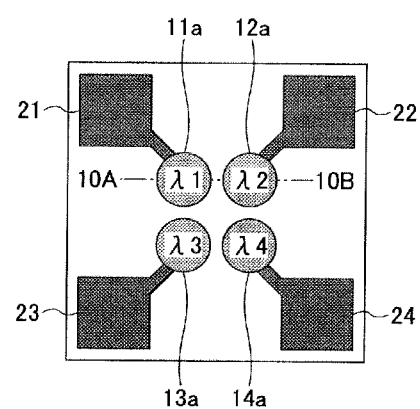
FIG. 10 is a top view of the surface emitting laser device of the second embodiment.
Figure 11:
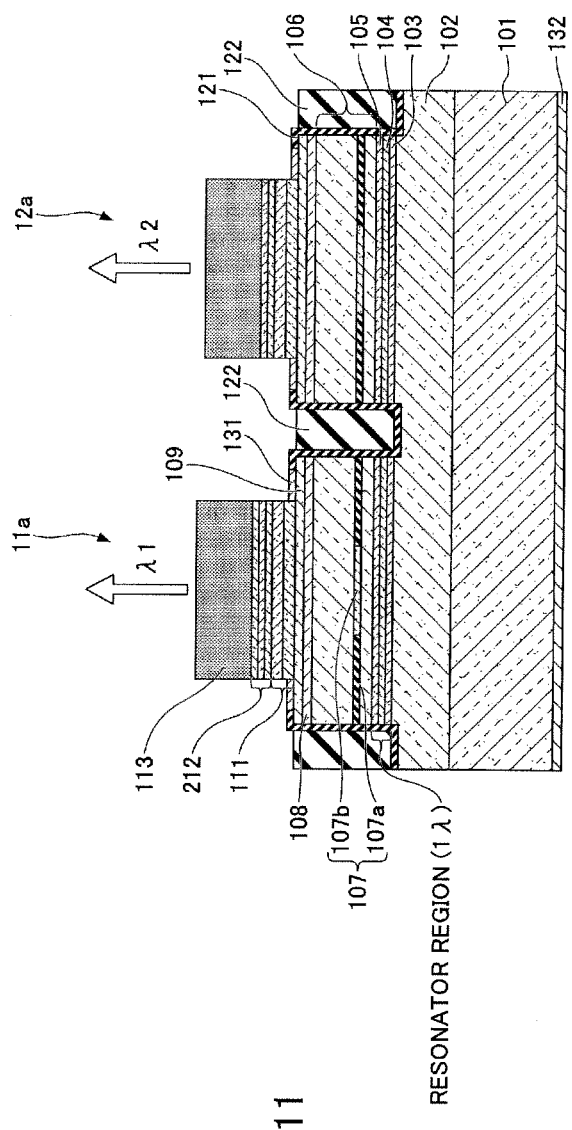
FIG. 11 is a cross-sectional view of the surface emitting laser device of the second embodiment.

In the following, the surface emitting laser device of the present embodiment is described with reference to FIGS. 10-12. As illustrated in FIG. 10, the surface emitting laser device of the present embodiment includes four surface emitting lasers 11a, 12a, 13a, and 14a arranged on a 300 μm square semiconductor chip. FIG. 11 is a cross-sectional view of the surface emitting laser device of the present embodiment along dot-dashed line 10A-10B of FIG. 10. Although not shown in FIG. 10, the surface emitting lasers 11a, 12a, 13a, and 14a each have upper electrodes arranged thereon. The upper electrode of the surface emitting laser 11a is connected to electrode pad 21, the upper electrode of the surface emitting laser 12a is connected to electrode pad 22, the upper electrode of the surface emitting laser 13a is connected to electrode pad 23, and the upper electrode of the surface emitting laser 14a is connected to electrode pad 24.

As illustrated in FIG. 11, the surface emitting laser device of the present embodiment includes the substrate 101 made of a semiconductor material on which the lower reflector 102, the lower spacer layer 103, the active layer 104, the upper spacer layer 105, the second upper reflector 106, the second phase adjustment layer 108, the contact layer 109, the first phase adjustment layer 111, the wavelength adjustment layer 212, and the first upper reflector 113 are layered. Mesas are formed by partially removing the contact layer 109, the second phase adjustment layer 108, the second upper reflector 106, the upper spacer layer 105, the active layer 104, the lower spacer layer 103, and the lower reflector 102 through dry etching, for example. A current confinement layer 107 is formed within the second upper reflector 106, and by forming the mesas, side faces of the current confinement layer 107 may be exposed. By oxidizing the exposed side faces of the current confinement layer 107 from the periphery of each of the mesas, the selectively oxidized region 107a may be formed at a peripheral portion of each of the mesas. In this way, the current confinement region 107b that is not oxidized may be formed at the center portion of each of the mesas. The protective film 121 is arranged on the side faces of the mesas and the bottom faces that have been exposed through etching upon forming the mesas, and the polyimide layer 122 is filled into the etched regions where layers have been removed.

Also, the upper electrode 131 is formed on the peripheral region of the upper face of the contact layer 109 of the mesa where the first phase adjustment layer 111 is not arranged, and the lower electrode 132 is formed on the rear face of the substrate 101.

In the surface emitting laser device of the present embodiment, the wavelength adjustment layer 212 that is arranged between the lower reflector 102 and the first upper reflector 113 is arranged to have different thicknesses at the surface emitting lasers 11a, 12a, 13a, and 14a. By arranging the wavelength adjustment layer 212 to have different thicknesses, the wavelengths of light emitted from the surface emitting lasers 11a, 12a, 13a, and 14a may be arranged to vary. That is, in the present embodiment, the wavelength adjustment layer 212 is arranged to have different thicknesses so that light with a first wavelength λ1 may be emitted from the surface emitting laser 11a, light with a second wavelength λ2 may be emitted from the surface emitting laser 12a, light with a third wavelength λ3 may be emitted from the surface emitting laser 13a, and light with a fourth wavelength λ4 may be emitted from the surface emitting laser 14a (where the wavelengths λ1-λ4 correspond to different wavelengths).

In the present embodiment, semiconductor layers such as the lower reflector 102, the lower spacer layer 103, the active layer 104, the upper spacer layer 105, the second upper reflector 106, the second phase adjustment layer 108, the contact layer 109, the first phase adjustment layer 111, and the wavelength adjustment layer 212 are epitaxially grown on the substrate 101 by MOCVD (Metal Organic Vapor Deposition) or MBE (Molecular Beam Epitaxy).

The substrate 101 is a n-GaAs substrate, and the lower reflector 102 is a multi-layer semiconductor film that is formed by alternately layering 35.5 pairs of a high refractive index layer made of n-$Al_{0.1}Ga_{0.9}As$ and a low refractive index layer made of n-$Al_{0.9}Ga_{0.1}As$ that each have an optical thickness of $\lambda/4$.

The lower spacer layer 103 and the upper spacer layer 105 are made of $Al_{0.2}Ga_{0.8}As$, and the active layer 104 is formed by alternately layering a GaInAs quantum well layer and a GaInPAs barrier layer. In the present embodiment, the lower spacer layer 103, the active layer 104, and the upper spacer layer 105 comprise a resonator region that has an optical thickness of approximately one wavelength (1λ).

The second upper reflector 106 is formed on the upper spacer layer 105. The second upper reflector 106 is made of a multi-layer semiconductor film that is formed by alternately layering 6 pairs of a high refractive index layer made of p-$Al_{0.1}Ga_{0.9}As$ and a low refractive index layer made of p-$Al_{0.9}Ga_{0.1}As$ that each have an optical thickness of $\lambda/4$.

Figure 12:
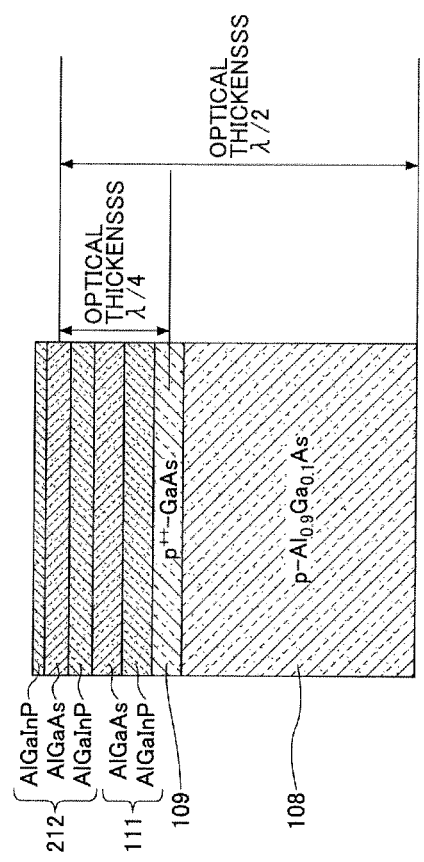
FIG. 12 is an enlarged partial view of the surface emitting laser device of the second embodiment.

As illustrated in FIG. 12, in the surface emitting laser device of the present embodiment, the second phase adjustment layer 108, the contact layer 109, the first phase adjustment layer 111, and the wavelength adjustment layer 212 are successively layered on the second upper reflector 106 in this order. In the present embodiment, the second phase adjustment layer 108 is made of p-$Al_{0.1}Ga_{0.9}As$, the contact layer 109 is made of $p^{++}$-GaAs, and the first phase adjustment layer 111 is made of a AlGaInP/AlGaAsP two-layer film. The wavelength adjustment layer 212 is made of a $(Al_{0.5}Ga_{0.5})_{0.52}In_{0.48}P/Al_{0.7}Ga_{0.3}As/(Al_{0.5}Ga_{0.5})_{0.52}In_{0.48}P$ three-layer film and the three layers are arranged to have thicknesses of 5.7 nm/5.7 nm/5.7 nm. The refractive index of the wavelength adjustment layer 212 is lower than that of the wavelength adjustment layer 121 of the first embodiment. The above combination of materials is used in the wavelength adjustment layer 212 of the present embodiment so that its layers may be selectively etched. With the above film thicknesses of the three layers of the wavelength adjustment layer 212, the four wavelengths of the surface emitting lasers may be arranged at a wavelength spacing of 0.5 nm.

According to an aspect of the present embodiment, by forming the wavelength adjustment layer 212 using a material with a lower refractive index than that of the wavelength adjustment layer 112 of the first embodiment, the semiconductor layers of the wavelength adjustment layer 212 may be designed to be thicker than the first embodiment in applications where laser wavelengths are adjusted at a dense wavelength spacing of 0.5 nm, for example. In this way, variations in growth speed upon forming the semiconductor layers may be reduced and variations in film thickness may be reduced. Accordingly, the surface emitting laser device of the present embodiment may be suitable for dense wavelength division multiplexing (DWDM), for example, that requires dense wavelength spacing.

As illustrated in FIG. 12, in the surface emitting laser device of the present embodiment, the optical thickness from the bottom side of the second phase adjustment layer 108 to the midsection of the wavelength adjustment layer 212; namely, the total optical thickness of the second phase adjustment layer 108, the contact layer 109, the first phase adjustment layer 111, and half the wavelength adjustment layer 212, is arranged to be approximately $\lambda/2$. Further, a low refractive index layer (with an optical thickness of $\lambda/4$) of a dielectric multi-layer film forming the first upper reflector 113 is arranged on the wavelength adjustment layer 212 so that the total optical thickness of the low refractive index layer, the wavelength adjustment layer 212, the first phase adjustment layer 111, the contact layer 109, and the second phase adjustment layer 108 may be approximately $3\lambda/4$. Also, the optical thickness from the midsection of the contact layer 109 to the midsection of the wavelength adjustment layer 212 is arranged to be $\lambda/4$. Further, in the present embodiment, the refractive indexes of the materials forming the second phase adjustment layer 108, the contact layer 109, the first phase adjustment layer 111, and the wavelength adjustment layer 212 are close to the refractive index of the low refractive index layer material $Al_{0.9}Ga_{0.1}As$ of the second upper reflector 106. Thus, the second phase adjustment layer 108, the contact layer 109, the first phase adjustment layer 111, and the wavelength adjustment layer 212 may function as a part of the low refractive index layers of the second upper reflector 106.

In the surface emitting laser device of the present embodiment, the wavelength adjustment layer 212 is arranged to have different thicknesses at the surface emitting lasers 11a, 12a, 13a, and 14a. Specifically, after forming the AlGaInP/AlGaAs/AlGaInP three-semiconductor-layer film as the wavelength adjustment layer 212, a suitable process such as a photolithography process or a selective etching process may be performed to adjust the number of semiconductor layers making up the wavelength adjustment layer 212 from three layers, two layers, one layer, to none as is necessary or desired. For example, at the surface emitting laser 11a, the wavelength adjustment layer 112 may be made of three semiconductor layers; at the surface emitting laser 12a, the wavelength adjustment layer 112 may be made of two semiconductor layers; at the surface emitting laser 13a, the wavelength adjustment layer 112 may be made of one semiconductor layer; and at the surface emitting laser 14a, the wavelength adjustment layer 112 may not be arranged. By changing the number of semiconductor layers making up the wavelength adjustment layer 212 in the manner described above, the wavelengths of light emitted from the surface emitting lasers 11a, 12a, 13a, and 14a may be arranged to vary.

In the present embodiment, the semiconductor layers of the wavelength adjustment layer 212 may be removed one layer at a time through wet etching, for example. In this case, a mixed solution of sulfuric acid, hydrogen peroxide and water may be used as the etching solution for removing AlGaAs, for example. Also, a mixed solution of hydrochloric acid and water may be used as an etching solution for removing AlGaInP, for example. Further, in the present embodiment, after the above wet etching process, the wavelength adjustment layer 212 and the first phase adjustment layer 111 are removed at the region where the upper electrode 131 is to be arranged. In this case, a mixed solution of sulfuric acid, hydrogen peroxide and water may be used as the etching solution for removing AlGaAs. Note that in the wavelength adjustment layer 212 of the present embodiment, AlGaInP corresponds to the first wavelength adjustment material and AlGaAs corresponds to the second wavelength adjustment material. Also, the etching solution used for etching the first wavelength adjustment material AlGaInP corresponds to the first etching solution, and the etching solution used for etching the second wavelength adjustment material AlGaAs corresponds to the second etching solution.

After performing the above wet etching processes, mesas are formed through dry etching, for example, by removing layers at predetermined regions to a certain depth so that the side faces of the current confinement layer 107 may be exposed. For example, in FIG. 11, the mesas are formed by removing the lower spacer layer 103, the active layer 104, the upper spacer layer 105, the second upper reflector 106, the second phase adjustment layer 108, and the contact layer 109 to expose the lower reflector 102. The top view shapes of the mesas may be arranged into circular shapes as in the present embodiment (see FIG. 10), or the mesas may be arranged into oval shapes, rectangular shapes, or square shapes, for example.

By forming the mesas through etching as described above, the side face of the current confinement layer 107 may be exposed. Then, each of the mesas is heat-treated with steam to oxidize the Al contained in the current confinement layer 107 made of AlAs from the periphery of the mesa to form the selectively oxidized region 107a made of $Al_xO_y$. In this way, the selectively oxidized region 107a is formed at the peripheral portion of the mesa, and a non-oxidized region of the current confinement layer 107 at the center portion of the mesa becomes the current confinement region 107b. By forming the selectively oxidized region 107a at the current confinement layer 107, a current confinement structure may be formed so that a current flow within the current confinement layer 107 may be restricted to the current confinement region 107b.

Then, the protective film 121 that is made of SiN is arranged to cover the mesas including the side faces of the mesas. Further, the polyimide layer 122 is formed at the regions where the semiconductor layers have been etched upon forming the mesas. The polyimide layer 122 is filled into the etched regions to planarize these regions. Then, the protective film 121 and the polyimide film 122 are removed from regions of the upper faces of the mesas where the upper electrode 131 and the first upper reflector 113 are to be formed, and the contact layer 109 and the wavelength adjustment layer 212 or the first phase adjustment layer 111 are exposed at these regions. Then, the upper electrode 131 corresponding to a p-side electrode is formed on a peripheral region of the upper face of the mesa where the contact layer 109 is exposed, and the lower electrode 132 corresponding to an n-side electrode is formed on the rear face of the substrate 101. The upper electrode 131 is formed for each of the surface emitting lasers 11a-14a whereas the lower electrode 132 corresponds to a common electrode for the surface emitting lasers 11a-14a.

Then, the first upper reflector 113 is formed on the region of the upper face of the mesa where the wavelength adjustment layer 212 or the phase adjustment layer 111 is exposed. The first reflector 113 is a dielectric multi-layer film that is formed by alternately layering 6 pairs of a high refractive index layer made of $TiO_2$ and a low refractive index layer made of $SiO_2$ that each have an optical thickness of $\lambda/4$ through electron beam evaporation, for example.

The surface emitting lasers of the surface emitting laser device manufactured in the above-described manner are configured to emit light in an orthogonal direction with respect to the face of the substrate 101. In the present embodiment, the protective film 121 made of SiN is arranged on the side faces of the mesas and the bottom faces that are exposed through etching upon forming the mesas so that the exposed faces may be protected and reliability of the surface emitting laser device may be improved.

In the following, the features of the present embodiment relating to the arrangement of the contact layer 109 below the wavelength adjustment layer 212 and adjustment of the optical thickness of the wavelength adjustment region (i.e., region from the bottom of the second phase adjustment layer 108 to the midsection of the wavelength adjustment layer 212) to approximately $\lambda/2$ as illustrated in FIG. 12 are described.

For example, in a case where a contact layer is arranged above a wavelength adjustment layer, the amount of current flowing through the surface emitting lasers may vary depending on the thickness of the wavelength adjustment layer at the surface emitting lasers, and in turn, the electric characteristics and light emitting characteristics of the surface emitting lasers may greatly vary due to the variations in the thickness of the wavelength adjustment layer in these surface emitting lasers. Also, when a current flows through the wavelength adjustment layer, electrical resistance may increase due to band discontinuity at the interfaces of the semiconductor layers forming the wavelength adjustment layer.

In contrast, in the present embodiment, the contact layer 109 is arranged below the wavelength adjustment layer 212. In this case, a current may be injected into the active layer 104 of each of the surface emitting lasers and a current does not have to flow through the wavelength adjustment layer 212. In this way, the surface emitting lasers with the wavelength adjustment layer 212 arranged at different thicknesses may be configured to have substantially uniform electrical characteristic and light emitting characteristics.

Figure 13A:
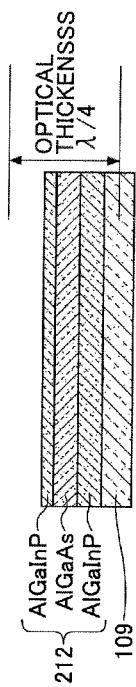
FIGS. 13A and 13B illustrate an exemplary configuration in which a wavelength adjustment layer is arranged directly above a contact layer.
Figure 13B:
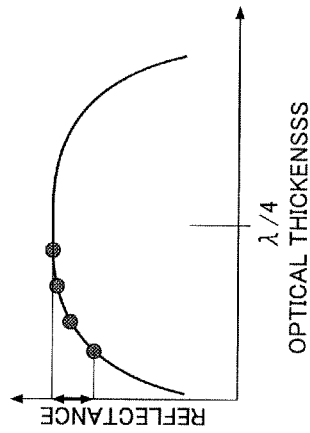

In the present embodiment, the contact layer 109 is arranged below the wavelength adjustment layer 212 for the foregoing reasons. Note that for purposes of reducing light absorption, the contact layer 109 is preferably arranged where the light intensity of the optical standing wave is the weakest. In this respect, the contact layer 109 is preferably arranged to be in contact with the wavelength adjustment layer 212 as illustrated in FIG. 13A. Also, in order to prevent degradation of laser characteristics due to light absorption, the contact layer 109 is preferably arranged at a position of a node of the optical standing wave. However, as illustrated in FIG. 13B, in this case, the reflectance values of the reflectors of the surface emitting lasers greatly vary from each other. As a result, there may be wide variations in the laser characteristics such as the threshold current of the surface emitting lasers. That is, in this case, the optical thickness from the contact layer 109 to the wavelength adjustment layer 212 in each of the surface emitting lasers having the wavelength adjustment layer 212 arranged at different thicknesses greatly varies from $\lambda/4$. As a result, variations occur in the reflectance of the surface emitting lasers. This in turn leads to variations in the laser characteristics such as the threshold current of the surface emitting lasers.

Figure 14A:
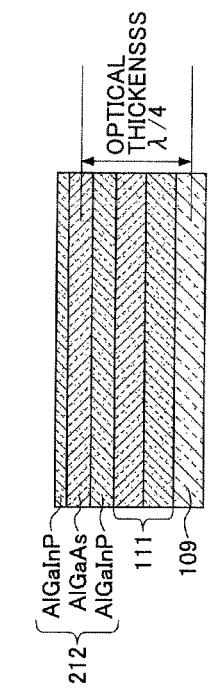
FIGS. 14A and 14B illustrate an arrangement of a first phase adjustment layer according to the second embodiment.
Figure 14B:
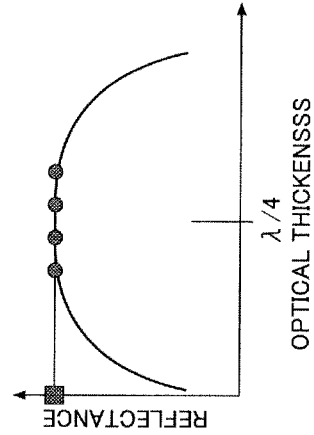

Accordingly, in the present embodiment, the first phase adjustment layer 111 is arranged between the contact layer 109 and the wavelength adjustment layer 212 as illustrated in FIG. 14A, and the thickness of the first phase adjustment layer 111 is adjusted so that the reflectance values of the surface emitting lasers may be substantially uniform. Specifically, as illustrated in FIG. 14A, the first phase adjustment layer 111 is arranged between the contact layer 109 and the wavelength adjustment layer 112 so that the average optical thickness of the contact layer 109, the first phase adjustment layer 111, and the wavelength adjustment layer 212 at the surface emitting lasers may be $\lambda/4$. In this way, as illustrated in FIG. 14B, the reflectance values of the surface emitting lasers having the wavelength adjustment layer 212 arranged at different thicknesses may be substantially uniform.

Figure 15:
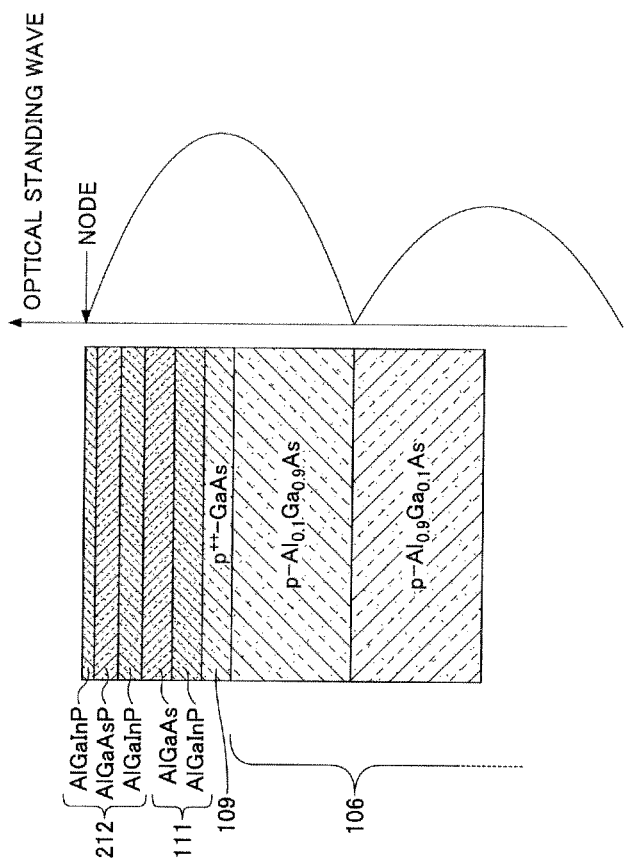
FIG. 15 illustrates an exemplary configuration in which the contact layer is arranged directly above a second upper reflector.

In the following, the relationship between the second upper reflector 106 and the contact layer 109 is described. FIG. 15 illustrates an exemplary case in which a $p\text{-}Al_{0.1}Ga_{0.9}As$ high refractive index layer is connected directly below the contact layer 109. In this case, the junction between the high refractive index layer at the lower side and the low refractive index layer at the upper side is positioned at an anti-node, and a significant amount of light absorption may occur at the contact layer 109.

Figure 16:
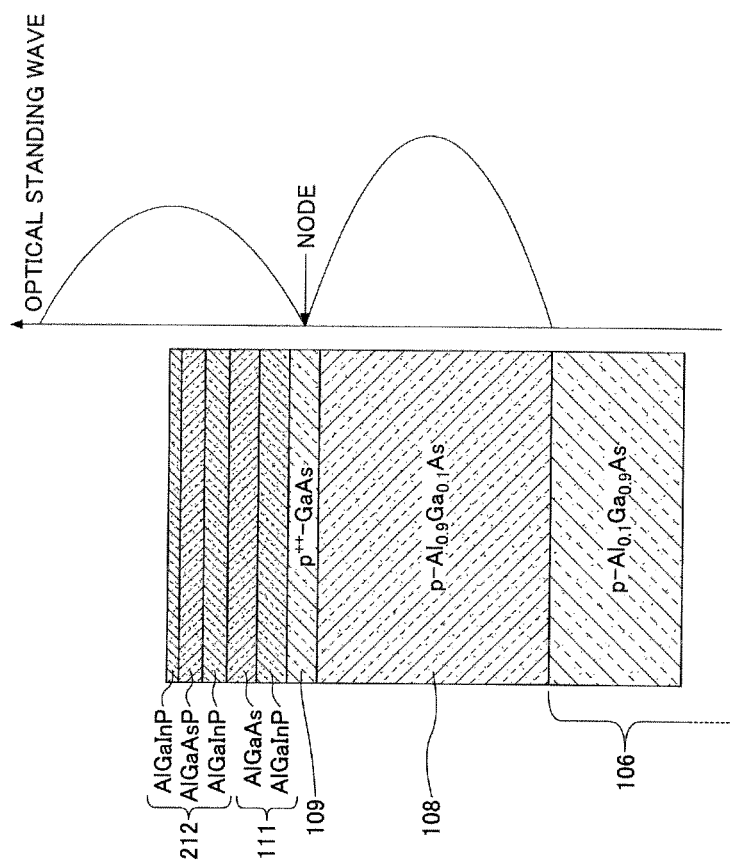
FIG. 16 illustrates an arrangement of a second phase adjustment layer according to the second embodiment.

In contrast, in the present embodiment, as illustrated in FIG. 16, the second phase adjustment layer 108 is arranged below the contact layer 109 to be in contact with the contact layer 109. The second phase adjustment layer 108 is made of a low refractive index material such as $p\text{-}Al_{0.9}Ga_{0.1}As$. The second phase adjustment layer 108 is formed so that the total optical thickness of the wavelength adjustment layer 212, the first phase adjustment layer 111, the contact layer 109, and the second phase adjustment layer 108 may be approximately $\lambda/2$. Further, the optical thickness of the low refractive index layers of the above layers, combined with the optical thickness $\lambda/4$ of the $SiO_2$ low refractive index layer of the dielectric multi-layer film arranged thereon is arranged to be approximately $3\lambda/4$. By arranging the second phase adjustment layer 108 made of a $p\text{-}Al_{0.9}Ga_{0.1}As$ layer with a predetermined optical thickness between the $p\text{-}Al_{0.1}Ga_{0.9}As$ high refractive index layer of the second upper reflector 106 and the contact layer 109, the reflectance values of the surface emitting lasers with the wavelength adjustment layer 212 arranged at different thicknesses may be arranged to be substantially uniform without disrupting phase matching of the layers.

In an embodiment of the present invention, the total optical thickness of the second phase adjustment layer 108, the contact layer 109, the first phase adjustment layer 111, and half the wavelength adjustment layer 212 may be arranged to be approximately $N\lambda/2$, where N represents a positive integer (i.e., N=1, 2, 3, . . . ). That is, although the above total optical thickness is arranged to be approximately $\lambda/2$ (N=1) in the present embodiment, the value of N may be greater than one (N=2, 3, . . . ). However, in this case, the surface emitting lasers may become more susceptible to influences of light absorption and the threshold current of the surface emitting lasers may be increased, for example. Thus, the value of N is preferably arranged to be a relatively small value.

According to an aspect of the present embodiment, by layering the second phase adjustment layer 108, the contact layer 109, the first phase adjustment layer 111, and the wavelength adjustment layer 212 in this order and arranging the total optical thickness of the second phase adjustment layer 108, the contact layer 109, the first phase adjustment layer 111, and half the wavelength adjustment layer 212 to be approximately $\lambda/2$, the reflectance of the surface emitting lasers 11a, 12a, 13a, and 14a having the wavelength adjustment layer 212 arranged at different optical thicknesses may be arranged to be substantially uniform. Also, by arranging the second phase adjustment layer 108 between the contact layer 109 and the second upper reflector 106 so that a node of the optical standing wave may be positioned at the contact layer 109, laser characteristics may be prevented from degrading and the laser characteristics and electric resistance values of the surface emitting lasers 11a, 12a, 13a, and 14a formed on the surface emitting laser device may be arranged to be substantially uniform.

Also, in the present embodiment, the surface of the contact layer 109 may be exposed by removing the first phase adjustment layer 111 through wet etching. The first phase adjustment layer 111 is formed by successively layering an AlGaInP layer and an AlGaAs layer in this order on the contact layer 109 that is made of $p^{++}$-GaAs. Thus, the contact layer 109 may be easily exposed by selectively etching the first phase adjustment layer 111 through wet etching.

Note that in order to reduce the wavelength spacing, the film thickness of the wavelength adjustment layer may be reduced. However, when the wavelength adjustment layer is arranged to be too thin, the surface emitting laser device may be susceptible to influences of uneven crystal growth or etching, for example. In this respect, the AlGaInP/AlGaAs/AlGaInP layer that is used as the wavelength adjustment layer material in the present embodiment has a lower refractive index compared to the GaInP/GaAsP/GaInP layer that is used in the first embodiment. In this way, with the same film thickness, a smaller optical thickness may be achieved in the present embodiment compared to the first embodiment. Accordingly, the present embodiment may be suitably used in applications that require fine wavelength adjustment at a dense wavelength spacing, for example.

Note that features of the present embodiment other than those described above may be identical to the first embodiment.

Third Embodiment

In the following, a surface emitting laser device according to a third embodiment of the present invention is described. The surface emitting laser device of the present embodiment is for emitting light at an oscillation wavelength in the 894.6 nm range.

Figure 17:
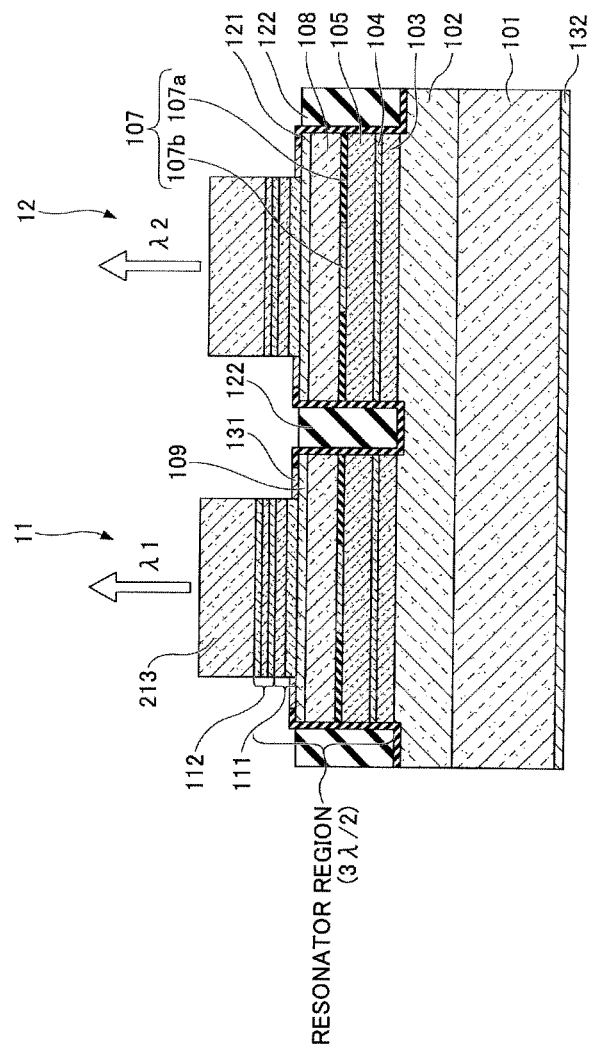
FIG. 17 is a cross-sectional view of a surface emitting laser device according to a third embodiment of the present invention.

FIG. 17 is a cross-sectional view of the surface emitting laser device of the present embodiment. Note that the top view of the surface emitting laser device of the present embodiment may be identical to that of the first embodiment as illustrated in FIG. 1. The surface emitting laser device of the present embodiment includes the substrate 101 made of a semiconductor material on which the lower reflector 102, the lower spacer layer 103, the active layer 104, the upper spacer layer 105, the current confinement layer 107, the second phase adjustment layer 108, the contact layer 109, the first phase adjustment layer 111, the wavelength adjustment layer 112, and an upper reflector 213 are layered. Also, mesas are formed by partially removing the contact layer 109, the second phase adjustment layer 108, the current confinement layer 107, the upper spacer layer 105, the active layer 104, the lower spacer layer 103, and the lower reflector 102 through dry etching, for example. By forming the mesas in this manner, side faces of the current confinement layer 107 may be exposed. By oxidizing the exposed side faces of the current confinement layer 107 from the periphery of the mesa, the selectively oxidized region 107a may be formed at the peripheral portion of the mesa. In this way, the current confinement region 107b that is not oxidized may be formed at the center portion of the mesa. The protective film 121 is arranged on the side faces of the mesas and bottom faces that have been formed through etching, and the polyimide layer 122 is filled into the regions where layers have been removed through etching.

Also, the upper electrode 131 is formed on a peripheral region of the upper face of the contact layer 109 of the mesa where the first phase adjustment layer 111 is not arranged, and the lower electrode 132 is formed on the rear face of the substrate 101.

In the surface emitting laser device of the present embodiment, the wavelength adjustment layer 112 that is formed between the lower reflector 102 and the upper reflector 213 is arranged to have different thicknesses at the surface emitting lasers. By arranging the wavelength adjustment layer 112 to have different thicknesses, the wavelengths of light emitted from the surface emitting lasers may be arranged to vary.

In the present embodiment, semiconductor layers such as the lower reflector 102, the lower spacer layer 103, the active layer 104, the upper spacer layer 105, the current confinement layer 107, the second phase adjustment layer 108, the contact layer 109, the first phase adjustment layer 111, and the wavelength adjustment layer 112 are epitaxially grown on the substrate 101 by MOCVD (Metal Organic Vapor Deposition) or MBE (Molecular Beam Epitaxy).

The substrate 101 is a n-GaAs substrate, and the lower reflector 102 is a multi-layer semiconductor film that is formed by alternately layering 35.5 pairs of a high refractive index layer made of n-$Al_{0.1}Ga_{0.9}As$ and a low refractive index layer made of n-$Al_{0.9}Ga_{0.1}As$ that each have an optical thickness of $\lambda/4$.

The lower spacer layer 103 and the upper spacer layer 105 are made of $Al_{0.2}Ga_{0.8}As$, and the active layer 104 is formed by alternately layering a GaInAs quantum well layer and a GaInPAs barrier layer.

The current confinement layer 107 that is made of AlAs is arranged on the upper spacer layer 105, and the second phase adjustment layer 108, the contact layer 109, the first phase adjustment layer 111, and the wavelength adjustment layer 112 are arranged on the current confinement layer 107. In the present embodiment, the second phase adjustment layer 108 is made of p-$Al_{0.2}Ga_{0.8}As$, the contact layer 109 is made of $p^{++}$-GaAs, the first phase adjustment layer 111 is made of a GaInP/GaAsP two-layer film, and the wavelength adjustment layer 112 is made of a GaInP/GaAsP/GaInP three-layer film.

Figure 18:
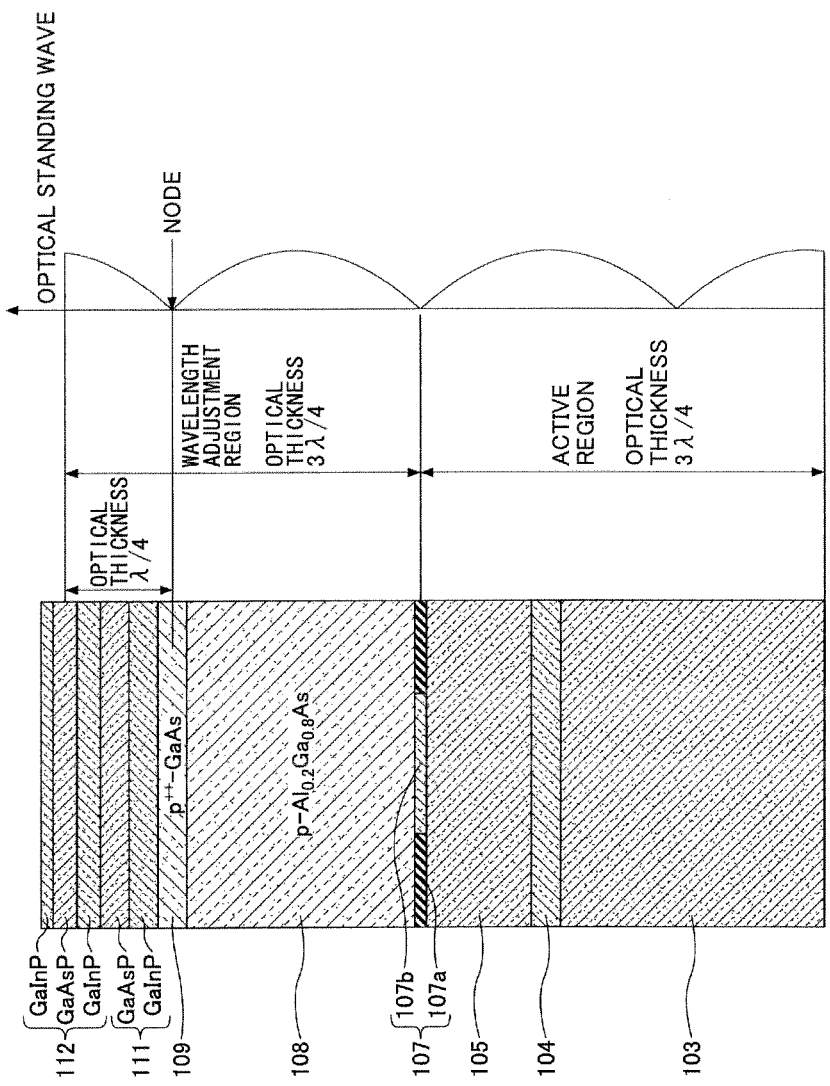
FIG. 18 is an enlarge partial view of the surface emitting laser device of the third embodiment.

In the surface emitting laser device of the present embodiment, the lower spacer layer 103, the active layer 104, the upper spacer layer 105, the current confinement layer 107, the second phase adjustment layer 108, the contact layer 109, the first phase adjustment layer 111, and the wavelength adjustment layer 112 form a resonator region, and this resonator region is arranged to have an optical thickness of approximately $3\lambda/2$. Further, as illustrated in FIG. 18, this resonator region may be divided into an active region including the lower spacer layer 103, the active layer 104, and the upper spacer layer 105, and a wavelength adjustment region including the second phase adjustment layer 108, the contact layer 109, the first phase adjustment layer 111, and the wavelength adjustment layer 112. The active region and the wavelength adjustment region are each arranged to have an optical thickness of approximately $3\lambda/4$. Thus, the current confinement layer 107, which is arranged between the active region and the wavelength adjustment region, is located approximately at the midsection of the resonator region.

In the surface emitting laser device of the present embodiment, the wavelength adjustment layer 112 is arranged to have different thicknesses at the surface emitting lasers. Specifically, after forming the GaInP/GaAsP/GaInP three-semiconductor-layer film as the wavelength adjustment layer 112, a suitable process such as a photolithography process or a selective etching process may be performed to adjust the number of semiconductor layers making up the wavelength adjustment layer 112 from three layers, two layers, one layer, to none as is necessary or desired. By changing the number of semiconductor layers making up the wavelength adjustment layer 112 in the manner described above, the wavelengths of light emitted from the surface emitting lasers may be arranged to vary.

In the present embodiment, the semiconductor layers of the wavelength adjustment layer 112 may be removed one layer at a time through wet etching, for example. In this case, a mixed solution of sulfuric acid, hydrogen peroxide and water may be used as the etching solution for removing GaAsP, for example. Also, a mixed solution of hydrochloric acid and water may be used as an etching solution for removing the GaInP, for example. Note that in the wavelength adjustment layer 112 of the present embodiment, GaInP corresponds to the first wavelength adjustment material and GaAsP corresponds to the second wavelength adjustment material. Also, the etching solution used for etching the first wavelength adjustment material GaInP corresponds to the first etching solution, and the etching solution used for etching the second wavelength adjustment material GaAsP corresponds to the second etching solution.

In the present embodiment, the semiconductor layers of the wavelength adjustment layer 112 may be partially removed through wet etching so that the wavelength adjustment layer 112 may be arranged to have a suitable number of semiconductor layers at each of the surface emitting lasers. Then, the upper reflector 213 is formed on the wavelength adjustment layer 112 through crystal growth. Then, the upper reflector 213, the wavelength adjustment layer 112, and the first phase adjustment layer 111 are removed by wet etching from peripheral regions of the upper face of the mesas where the upper electrodes 131 are to be formed. In this case, a mixed solution of sulfuric acid, hydrogen peroxide and water may be used as the etching solution for removing GaAs, for example.

The upper reflector 213 is a semiconductor multi-layer film that is formed by alternately layering 24 pairs of a high refractive index layer made of $Al_{0.1}Ga_{0.9}As$ and a low refractive index layer made of $Al_{0.9}Ga_{0.1}As$ that each have an optical thickness of $\lambda/4$. Note that although the upper reflector 213 described above corresponds to a semiconductor multi-layer film, the upper reflector 213 may alternatively be a dielectric multi-layer film. For example, the upper reflector 213 may be formed by alternately layering multiple layers of a high refractive index layer made of $TiO_2$ and a low refractive index layer made of $SiO_2$ that each have an optical thickness of $\lambda/4$ through electron beam evaporation.

Then, mesas are formed through dry etching, for example, by removing layers at predetermined regions to a certain depth so that the side faces of the current confinement layer 107 may be exposed. For example, in FIG. 17, the mesas are formed by removing the lower spacer layer 103, the active layer 104, the upper spacer layer 105, the current confinement layer 107, the second phase adjustment layer 108, and the contact layer 109 to expose the lower reflector 102. The top view shapes of the mesas may be arranged into circular shapes, oval shapes, rectangular shapes, or square shapes, for example.

By forming the mesas through etching as described above, the side faces of the current confinement layer 107 may be exposed. Then, each of the mesas is heat-treated with steam to oxidize the current confinement layer 107 made of AlAs from the periphery of the mesa to form the selectively oxidized region 107a made of $Al_xO_y$. In this way, the selectively oxidized region 107a is formed at the peripheral portion of the mesa, and a non-oxidized region of the current confinement layer 107 at the center portion of the mesa becomes the current confinement region 107b. By forming the selectively oxidized region 107a at the current confinement layer 107 in the manner described above, a current confinement structure may be formed so that a current flow within the current confinement layer 107 may be restricted to the current confinement region 107b.

Then, the protective film 121 that is made of SiN is arranged to cover the mesas including the side faces of the mesas. Further, the polyimide layer 122 is arranged at the regions where the semiconductor layers have been etched upon forming the mesas. The polyimide layer 122 is filled into the etched regions to planarize these regions. Then, the protective film 121 and the polyimide film 122 are removed from regions of the upper faces of the mesas where the upper electrode 131 and the first upper reflector 113 are to be formed, and the contact layer 109 and the wavelength adjustment layer 112 or the first phase adjustment layer 111 are exposed at these regions. Then, the upper electrode 131 corresponding to a p-side electrode is formed on a peripheral region of the upper face of the mesa where the contact layer 109 is exposed, and the lower electrode 132 corresponding to an n-side electrode is formed on the rear face of the substrate 101. The upper electrode 131 is individually arranged at each of the surface emitting lasers whereas the lower electrode 132 corresponds to a common electrode for the surface emitting lasers.

The surface emitting lasers of the surface emitting laser device manufactured in the above-described manner are configured to emit light in an orthogonal direction with respect to the face of the substrate 101. In the present embodiment, the protective film 121 made of SiN is arranged on the side faces of the mesas and the bottom faces that are exposed through etching upon forming the mesas so that reliability of the surface emitting laser device may be improved. That is, by arranging the protective film 121 on the side faces of the mesas and the bottom faces that are exposed through etching upon forming the mesas, layers containing Al that are prone to corrosion may be protected so that the reliability of the surface emitting laser device may be improved.

In the following, the features of the present embodiment relating to the arrangement of the contact layer 109 below the wavelength adjustment layer 112 via the first phase adjustment layer 111 and adjustment of the optical thickness of the wavelength adjustment region (i.e., region from the bottom of the second phase adjustment layer 108 to the midsection of the wavelength adjustment layer 112) to approximately $3\lambda/4$ as illustrated in FIG. 18 are described.

For example, in a case where a contact layer is arranged above a wavelength adjustment layer, the amount of current flowing through the surface emitting lasers may vary depending on the thickness of the wavelength adjustment layer at each of the surface emitting lasers, and in turn, the electric characteristics and light emitting characteristics of the surface emitting lasers may greatly vary due to the variations in the thickness of the wavelength adjustment layer in these surface emitting lasers. Also, when a current flows through the wavelength adjustment layer, electrical resistance may increase due to band discontinuity at the interfaces of the semiconductor layers forming the wavelength adjustment layer.

In contrast, in the present embodiment, the contact layer 109 is arranged below the wavelength adjustment layer 112.

In this case, a current may be injected into the active layer 104 of each of the surface emitting lasers and a current does not have to flow through the wavelength adjustment layer 112. In this way, the surface emitting lasers having the wavelength adjustment layer 112 arranged at different thicknesses may be configured to have substantially uniform electrical characteristic and light emitting characteristics.

Figure 4B:
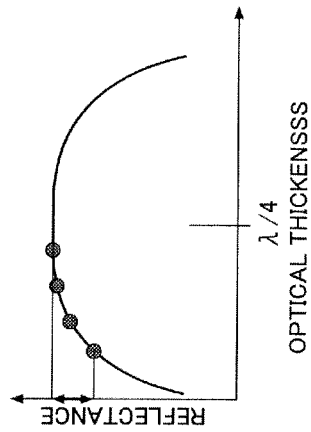

In the present embodiment, the contact layer 109 is arranged below the wavelength adjustment layer 112 for the foregoing reasons. Note that for purposes of reducing light absorption, the contact layer 109 is preferably arranged where the light intensity of the optical standing wave is the weakest. In this respect, the contact layer 109 is preferably arranged to be in contact with the wavelength adjustment layer 112 as illustrated in FIG. 4A. Also, in order to prevent degradation of laser characteristics due to light absorption, the contact layer 109 is preferably arranged at a position of a node of the optical standing wave. In this case, as illustrated in FIG. 4B, the reflectance values of the reflectors of the surface emitting lasers greatly vary from each other. As a result, there may be wide variations in the laser characteristics such as the threshold current of the surface emitting lasers. That is, in this case, the optical thickness from the contact layer 109 to the wavelength adjustment layer 112 in each of the surface emitting lasers having the wavelength adjustment layer 112 arranged at different thicknesses greatly varies from $\lambda/4$. As a result, variations occur in the reflectance of the surface emitting lasers. This in turn leads to variations in the laser characteristics such as the threshold current of the surface emitting lasers.

Accordingly, in the present embodiment, the first phase adjustment layer 111 is arranged between the contact layer 109 and the wavelength adjustment layer 112 as illustrated in FIG. 5A, and the thickness of the first phase adjustment layer 111 is adjusted so that the reflectance values of the surface emitting lasers may be substantially uniform. Specifically, the average optical thickness of the contact layer 109, the first phase adjustment layer 111, and the wavelength adjustment layer 112 is arranged to be $\lambda/4$ as illustrated in FIG. 5A, and in this way, the reflectance values of the surface emitting lasers having the wavelength adjustment layer 112 arranged at different thicknesses may be arranged to be substantially uniform as illustrated in FIG. 5B.

In the following, the second phase adjustment layer 108 that is arranged below the contact layer 109 is described. In the present embodiment, the second phase adjustment layer 108 is made of a p-$Al_{0.2}Ga_{0.8}As$ layer with an optical thickness of approximately $\lambda/2$.

Specifically, the second phase adjustment layer 108 is arranged above the active layer 104 (i.e., toward the upper electrode 131 side), and is made of p-$Al_{0.2}Ga_{0.8}As$ in order to form a p-n junction. The second phase adjustment layer 108 is arranged to have an optical thickness of approximately $\lambda/2$ so that the current confinement layer 107 may be formed at a position of a node of the optical standing wave within the resonator region. That is, the optical thickness of the second phase adjustment layer 108 is arranged to be approximately $\lambda/2$ so that the contact layer 109, which if formed at a position of a node, and the current confinement region 107, which is also formed at a position of a node, may be spaced apart by an optical thickness of approximately $\lambda/2$.

In an embodiment of the present invention, the total optical thickness of the second phase adjustment layer 108, the contact layer 109, the first phase adjustment layer 111, and half the wavelength adjustment layer 112 may be arranged to be approximately $(2N+1)\times\lambda/4$, where N represents a positive integer (N=1, 2, 3, ...). That is, although the optical thickness of the wavelength adjustment region is arranged to be approximately $3\lambda/4$ (N=1) in the present embodiment, N may alternatively be greater than one (N=2, 3, ...). However, in this case, the surface emitting lasers may become more susceptible to influences of light absorption and the threshold current of the surface emitting lasers may be increased, for example. Thus, the value of N is preferably arranged to be a relatively small value.

According to an aspect of the present embodiment, by forming the wavelength adjustment region including the second phase adjustment layer 108, the contact layer 109, the first phase adjustment layer 11, and the wavelength adjustment layer 112, and arranging the optical thickness of this wavelength adjustment region to be approximately $3\lambda/4$, the contact layer 109 may be formed at the position of a node of the optical standing wave, degradation of laser characteristics may be prevented, and the laser characteristics and electrical resistance values of the surface emitting lasers of the surface emitting laser device that are configured to emit light at different wavelengths may be arranged to be substantially uniform.

Note that features of the present embodiment other than those described above may be identical to the first embodiment. Also, in one modified embodiment, the wavelength adjustment layer 112 may be replaced by the wavelength adjustment layer 212 of the second embodiment.

Fourth Embodiment

Figure 19:
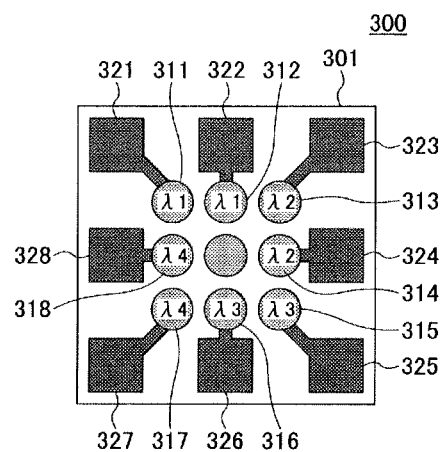
FIG. 19 is a top view of a surface emitting laser device according to a fourth embodiment of the present invention.

In the following, a surface emitting laser device 300 according to a fourth embodiment of the present invention is described. FIG. 19 is a top view of the surface emitting laser device 300 of the present embodiment. The surface emitting laser device 300 has eight surface emitting lasers formed on a substrate 301, every two of these surface emitting lasers being configured to emit light at the same wavelength. The surface emitting laser device 300 of the present embodiment is for emitting light at wavelengths in the 894.6 nm range as in the first embodiment.

Specifically, the surface emitting laser device 300 of the present embodiment has a first surface emitting laser 311, a second surface emitting laser 312, a third surface emitting laser 313, a fourth surface emitting laser 314, a fifth surface emitting laser 315, a sixth surface emitting laser 316, a seventh surface emitting laser 317, and an eighth surface emitting laser 318 formed on the substrate 301. Although not shown in FIG. 19, the surface emitting lasers 311-318 each have upper electrodes arranged thereon that are connected to corresponding electrode pads. That is, the upper electrode of the first surface emitting laser 311 is connected to electrode pad 321, the upper electrode of the second surface emitting laser 312 is connected to electrode pad 322, the upper electrode of the third surface emitting laser 313 is connected to electrode pad 323, the upper electrode of the fourth surface emitting laser 314 is connected to electrode pad 324, the upper electrode of the fifth surface emitting laser 315 is connected to electrode pad 325, the upper electrode of the sixth surface emitting laser 316 is connected to electrode pad 326, the upper electrode of the seventh surface emitting laser 317 is connected to electrode pad 327, and the upper electrode of the eighth surface emitting laser 318 is connected to electrode pad 328.

The surface emitting lasers 311-318 are arranged so that every two surface emitting lasers emit light at the same wavelength. Specifically, the first surface emitting laser 311 and the second surface emitting laser 312 are configured to emit light at wavelength $\lambda 1$, the third surface emitting laser 313 and the fourth surface emitting laser 314 are configured to emit light at wavelength λ2, the fifth surface emitting laser 315 and the sixth surface emitting laser 316 are configured to emit light at wavelength λ3, and the seventh surface emitting laser 317 and the eighth surface emitting laser 318 are configured to emit light at wavelength 14, where the wavelengths λ1-λ4 represent different wavelengths. To configure the surface emitting lasers to emit light at different wavelengths in the present embodiment, a wavelength adjustment layer such as the wavelength adjustment layer 112 of the first embodiment is arranged at the surface emitting lasers and the thickness of the wavelength adjustment layer is adjusted according to the wavelength of the surface emitting lasers. In the illustrated example, each of the electrode pads 321-328 is arranged to be approximately 50 μm square in size, and the substrate 301 corresponds to a 300 μm square semiconductor chip.

According to an aspect of the present embodiment, by including two surface emitting lasers that emit light at the same wavelength, when one of the two surface emitting lasers with the same laser wavelength fails to emit light due to a malfunction or a defect, for example, the other one of the surface emitting lasers may be used to emit light. Thus, the operating life of the surface emitting laser device may be prolonged and the yield of the surface emitting laser device may be improved, for example. Also, in the surface emitting laser device of the present embodiment, in addition to using a surface emitting laser configured to emit light at a wavelength closest to a target wavelength, another surface emitting laser configured to emit light at a second closest wavelength may be used as a backup so that the operating life of the surface emitting laser device may be prolonged further.

Note that other configurations and features of the surface-emitting laser element 300 according to the present embodiment may be similar to those of the surface-emitting laser device according to the first embodiment. Also, in other modified embodiments, the surface emitting laser device configuration of the present embodiment may be applied to the surface emitting laser devices of the second embodiment and the third embodiment.

Fifth Embodiment

In the following, a fifth embodiment of the present invention is described. The fifth embodiment relates to a CPT (Coherent Population Trapping) atomic oscillator (atomic clock) that uses the D1-line of cesium (Cs) and a surface emitting laser device that is used in such an atomic oscillator.

Atomic oscillators (atomic clocks) are capable of making very accurate time measurements, and technology for reducing the size of such atomic clocks is in demand. Atomic oscillators are configured to oscillate based on the transition energy of electrons in alkali metal atoms. Specifically, the transition energy of electrons in alkali metal atoms without disturbance is capable of acquiring extremely accurate values, and hence atomic oscillators may achieve frequency stability that is several digits higher than the frequency stability of quartz oscillators, for example. There are several types of atomic oscillators, and the CPT atomic oscillator, as one type of atomic oscillator, may have frequency stability about three digits higher than the quartz oscillator. Also, techniques are expected to be developed for forming the CPT atomic oscillator in ultra-compact size with ultra-low electric power consumption.

Figure 20:
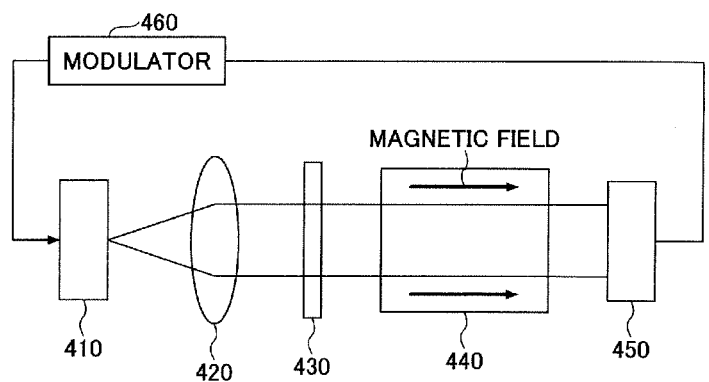
FIG. 20 is a block diagram illustrating a configuration of an atomic oscillator according to a fifth embodiment of the present invention.

Referring to FIG. 20, the atomic oscillator according to the fifth embodiment is described below. The atomic oscillator of the present embodiment is a compact size CPT atomic oscillator including a light source 410, a collimate lens 420, a λ/4 wave plate 430, an alkali metal cell 440, a photodetector 450 and a modulator 460.

The light source 410 uses one of the surface-emitting laser devices according to the first through fourth embodiments described above. The alkali metal cell 440 encapsulates cesium (Cs) atomic gas as alkali metal and utilizes the transition of the D1-line of cesium. The photodetector 450 uses a photodiode.

In the atomic oscillator according to the present embodiment, an electron in the cesium (Cs) atom is excited by irradiating light from the light source 410 onto the alkali metal cell 440 encapsulating the cesium (Cs) atomic gas. The light irradiated from the light source 410 that is transmitted through the alkali metal cell 440 is detected by the photodetector 450 as a signal, the detected signal is fed back to the modulator 460, and the modulator 460 modulates the surface-emitting laser device of the light source 410.

Figure 21:
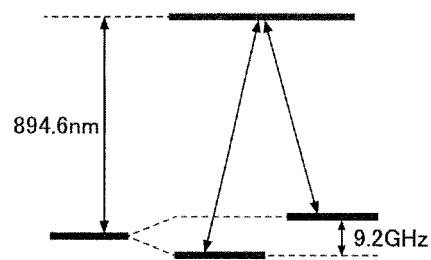
FIG. 21 illustrates an atomic energy level in a CPT atomic oscillator.
Figure 22:
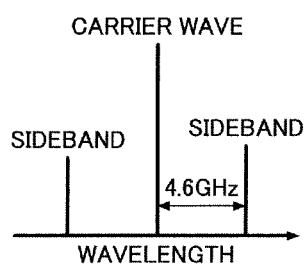
FIG. 22 illustrates an output wavelength of a surface emitting laser when the surface emitting laser is modulated.
Figure 23:
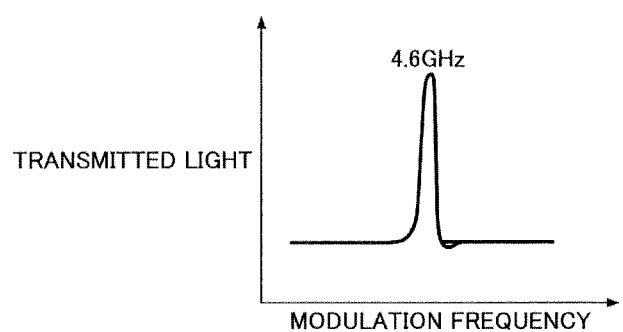
FIG. 23 illustrates a relationship between a modulation frequency and an amount of transmitted light.

FIG. 21 illustrates an atomic energy level of the CPT atomic oscillator. The atomic oscillator of the present embodiment utilizes a phenomenon in light absorption, which decreases when electrons are simultaneously excited from two ground levels to an excitation level. A surface emitting laser with a carrier wave wavelength close to 894.6 nm is used for the light source 410. The wavelength of the carrier wave may be tuned by changing a temperature or an output of the surface emitting laser. As illustrated in FIG. 22, when the surface emitting laser is modulated, sidebands are generated at the two sides of the carrier wave, and the frequency difference of the sidebands is modulated to be 4.6 GHz to match the natural frequency of cesium (Cs) atoms which is 9.2 GHz. As illustrated in FIG. 23, the amount of light transmitted through the excited Cs gas reaches a maximum level when the frequency difference between the sidebands matches the natural frequency of the Cs atoms. Thus, the light transmitted through the excited Cs gas is fed back to the modulator 460 to adjust the modulation frequency of light emitting from the surface emitting laser device of the light source 410 such that the output of the photodetector 450 maintains the maximum value. Because the natural frequency of Cs atoms is extremely stable, the modulation frequency maintains a stable value and this information is obtained through its output.

In the case where the laser wavelength of the atomic oscillator is 894.6 nm, the light source 410 requires a surface emitting laser that is capable of emitting light with a wavelength within ±1 nm, and more preferably within ±0.3 nm, of the 894.6 nm wavelength. It is generally difficult for a surface emitting laser to achieve a uniform oscillation wavelength within a range of ±1 nm, for example, owing to variations in the film thickness of films formed through crystal growth. However, because the surface emitting laser devices according to the first through fourth embodiments of the present invention have plural surface emitting lasers with different oscillation wavelengths formed on a single chip, one of the surface emitting lasers that emits light with a wavelength closest to 894.6 nm may be selectively used so that light with the desired oscillation wavelength may be emitted. In this way, the yield of the surface emitting laser device may be improved and the atomic oscillator may be manufactured at a lower cost, for example.

According to an aspect of the present embodiment, by using the surface emitting laser devices according to the first through fourth embodiments of the present invention that enable precise control of the wavelength spacing of the surface emitting lasers, the wavelength spacing may be easily adjusted to an optimal wavelength spacing in consideration of variations in the oscillation wavelengths caused by crystal growth so that the yield of the oscillation wavelength may be improved. Further, by using the surface emitting laser device according to the fourth embodiment, the operating life of the atomic oscillator may be prolonged.

Note that although the atomic oscillator of the present embodiment utilizes cesium (Cs) as alkali metal and a surface emitting laser emitting light with a wavelength of 894.6 nm for utilizing the transition of the D1-line of Cs, in alternative embodiments, a surface emitting laser utilizing the transition of the D2-line of Cs that emits light with a wavelength of 852.3 nm may be used. In further embodiments, rubidium (Rb) may be utilized as alkali metal. In this case, a surface-emitting laser emitting light with a wavelength of 795.0 nm may be used if the transition of the D1-line of Rb is utilized, or a surface emitting laser emitting light with a wavelength of 780.2 nm may be used if the transition of the D2-line of Rb is utilized. The material composition of the active layer may be designed according to the laser wavelength. Moreover, the modulation frequency for Rb may be 3.4 GHz for 87 Rb and 1.5 GHz for 85 Rb. Note that a wavelength range of ±1 nm is still desired for the surface emitting lasers with the above laser wavelengths.

Although certain preferred embodiments of the present invention have been described above for the purpose of illustration, the present invention is not limited to these embodiments and various changes and modifications may be made without departing from the scope of the present invention. Further, although an exemplary application of the surface emitting laser device in an atomic oscillator is described above, the surface emitting laser device of the present invention may also be used in other applications that require light with a predetermined wavelength such as gas sensor. Note that by selectively using a surface emitting laser that emits light with the desired wavelength in such applications, effects and advantages similar to those achieved in the atomic oscillator using the surface emitting laser device of the present invention may be achieved, for example.

The present application is based on and claims the benefit of priority of Japanese Patent Application No. 2012-163012 filed on Jul. 23, 2012, and Japanese Patent Application No. 2013-114880 filed on May 31, 2013, the entire contents of which are hereby incorporated by reference.

What is claimed is:

1. A surface emitting laser device comprising:
a lower reflector formed on a substrate;
an active layer formed on the lower reflector;
an upper reflector formed on the active layer;
a plurality of surface emitting lasers configured to emit light; and
a second phase adjustment layer, a contact layer, a first phase adjustment layer, and a wavelength adjustment layer that are successively layered from the active layer side and are arranged within the lower reflector, between the lower reflector and the active layer, within the upper reflector, or between the upper reflector and the active layer;
wherein a total optical thickness from the active layer side of the second phase adjustment layer to a midsection of the wavelength adjustment layer is arranged to be approximately $(2N+1)\times\lambda/4$, where $\lambda$ represents a wavelength of the light emitted by the surface emitting lasers, and N represents a positive integer;
wherein an optical thickness from the active layer side of the second phase adjustment layer to a midsection of the contact layer is arranged to be approximately $N\lambda/2$; and
wherein the surface emitting lasers include a first surface emitting laser and a second surface emitting laser that have the wavelength adjustment layer arranged at different thicknesses and are configured to emit light with different wavelengths.

2. A surface emitting laser device comprising:
a lower reflector formed on a substrate, an active layer formed on the lower reflector, an upper reflector formed on the active layer;
a plurality of surface emitting lasers configured to emit light;
a second phase adjustment layer, a contact layer, a first phase adjustment layer, and a wavelength adjustment layer that are successively layered from the active layer side and are arranged within the lower reflector or within the upper reflector;
wherein a total optical thickness from the active layer side of the second phase adjustment layer to a midsection of the wavelength adjustment layer is arranged to be approximately $N\lambda/2$, where $\lambda$ represents a wavelength of the light emitted by the surface emitting lasers, and N represents a positive integer;
wherein an optical thickness from the active layer side of the second phase adjustment layer to a midsection of the contact layer is arranged to be approximately $(2M-1)\times\lambda/4$, where M represents a positive integer; and
wherein the surface emitting lasers include a first surface emitting laser and a second surface emitting laser that have the wavelength adjustment layer arranged at different thicknesses and are configured to emit light with different wavelengths.

3. The surface emitting laser device as claimed in claim 1, wherein
the upper reflector includes a first upper reflector and a second upper reflector, the first upper reflector being formed by alternately layering a first set of materials having different refractive indexes, and the second upper reflector being formed by alternately layering a second set of materials having different refractive indexes; and
the second upper reflector, the second phase adjustment layer, the contact layer, the first phase adjustment layer, the wavelength adjustment layer, and the first upper reflector are successively layered from the active layer side.

4. The surface emitting laser device as claimed in claim 1, wherein
the second phase adjustment layer, the contact layer, the first phase adjustment layer, the wavelength adjustment layer, and the upper reflector are successively layered from the active layer side; and
the upper reflector is formed by alternately layering a set of materials having different refractive indexes.

5. The surface emitting laser device as claimed in claim 3, wherein
the substrate is a semiconductor crystal substrate that exhibits conductivity; and
the lower reflector, the active layer, the second upper reflector, the second phase adjustment layer, the contact layer, and the first phase adjustment layer are formed by epitaxially growing a semiconductor material on the substrate.

6. The surface emitting laser device as claimed in claim 1, wherein
at least a part of the upper reflector is formed by alternately layering dielectric materials having different refractive indexes.

7. The surface emitting laser device as claimed in claim 1, wherein the wavelength adjustment layer includes a first film made of a first wavelength adjustment material and a second film made of a second wavelength adjustment material;

the first film and the second films are partially removed by wet etching;

a first etching solution used for etching the first wavelength adjustment material and a second etching solution used for etching the second wavelength adjustment material are different from each other; and the first film and the second film are partially removed one at a time by wet etching so that a thickness of the wavelength adjustment layer is varied.

8. The surface emitting laser device as claimed in claim 7, wherein the first wavelength adjustment material includes GaInP; and the second wavelength adjustment material includes GaAsP.

9. The surface emitting laser device as claimed in claim 1, wherein the wavelength of the light emitted from at least one of the surface emitting lasers is arranged to be at least one of 780.2 nm, 795.0 nm, 852.3 nm, and 894.6 nm.

10. An atomic oscillator comprising:

the surface emitting laser device as claimed in claim 1;

an alkali metal cell encapsulating alkali metal; and a photodetector configured to detect light transmitted through the alkali metal cell of light irradiated on the alkali metal cell by the surface emitting lasers of the surface emitting laser device, the light irradiated by the surface emitting lasers including sidebands;

wherein a modulation frequency is controlled based on light absorption characteristics obtained from a quantum interference effect caused by two different sets of resonance light resulting from irradiating light with two different wavelengths included in the light irradiated on the alkali metal cell by the surface emitting lasers.

11. The atomic oscillator as claimed in claim 10, wherein the light with the two different wavelengths correspond to light of the sidebands irradiated by the surface-emitting lasers.

12. The surface emitting laser device as claimed in claim 2, wherein the upper reflector includes a first upper reflector and a second upper reflector, the first upper reflector being formed by alternately layering a first set of materials having different refractive indexes, and the second upper reflector being formed by alternately layering a second set of materials having different refractive indexes; and the second upper reflector, the second phase adjustment layer, the contact layer, the first phase adjustment layer, the wavelength adjustment layer, and the first upper reflector are successively layered from the active layer side.

13. The surface emitting laser device as claimed in claim 12, wherein the substrate is a semiconductor crystal substrate that exhibits conductivity; and the lower reflector, the active layer, the second upper reflector, the second phase adjustment layer, the contact layer, and the first phase adjustment layer are formed by epitaxially growing a semiconductor material on the substrate.

14. The surface emitting laser device as claimed in claim 2, wherein at least a part of the upper reflector is formed by alternately layering dielectric materials having different refractive indexes.

15. The surface emitting laser device as claimed in claim 2, wherein the wavelength adjustment layer includes a first film made of a first wavelength adjustment material and a second film made of a second wavelength adjustment material;

the first film and the second films are partially removed by wet etching;

a first etching solution used for etching the first wavelength adjustment material and a second etching solution used for etching the second wavelength adjustment material are different from each other; and the first film and the second film are partially removed one at a time by wet etching so that a thickness of the wavelength adjustment layer is varied.

16. The surface emitting laser device as claimed in claim 15, wherein the first wavelength adjustment material includes GaInP; and the second wavelength adjustment material includes GaAsP.

17. The surface emitting laser device as claimed in claim 2, wherein the wavelength of the light emitted from at least one of the surface emitting lasers is arranged to be at least one of 780.2 nm, 795.0 nm, 852.3 nm, and 894.6 nm.

18. An atomic oscillator comprising:

the surface emitting laser device as claimed in claim 2;

an alkali metal cell encapsulating alkali metal; and a photodetector configured to detect light transmitted through the alkali metal cell of light irradiated on the alkali metal cell by the surface emitting lasers of the surface emitting laser device, the light irradiated by the surface emitting lasers including sidebands;

wherein a modulation frequency is controlled based on light absorption characteristics obtained from a quantum interference effect caused by two different sets of resonance light resulting from irradiating light with two different wavelengths included in the light irradiated on the alkali metal cell by the surface emitting lasers.

19. The atomic oscillator as claimed in claim 18, wherein the light with the two different wavelengths correspond to light of the sidebands irradiated by the surface-emitting lasers.

* * * * *